United States Patent
Swier et al.

(10) Patent No.: US 9,927,703 B2
(45) Date of Patent: Mar. 27, 2018

(54) LAYERED POLYMER STRUCTURES AND METHODS

(71) Applicants: Dow Corning Corporation, Midland, MI (US); Dow Corning Toray Co., Ltd., Tokyo (JP)

(72) Inventors: Steven Swier, Midland, MI (US); Shin Yoshida, Ichihara (JP); Masaaki Yoshida, Ichihara (JP)

(73) Assignee: DOW CORNING CORPORATION, Midland, MI (US)

(*) Notice: Subject to any disclaimer, the term of this patent is extended or adjusted under 35 U.S.C. 154(b) by 199 days.

(21) Appl. No.: 14/653,478

(22) PCT Filed: Dec. 20, 2013

(86) PCT No.: PCT/US2013/077064
§ 371 (c)(1),
(2) Date: Jun. 18, 2015

(87) PCT Pub. No.: WO2014/100652
PCT Pub. Date: Jun. 26, 2014

(65) Prior Publication Data
US 2016/0204319 A1    Jul. 14, 2016

Related U.S. Application Data

(60) Provisional application No. 61/740,867, filed on Dec. 21, 2012.

(51) Int. Cl.
*C08L 83/04* (2006.01)
*H01L 33/56* (2010.01)
(Continued)

(52) U.S. Cl.
CPC ............ *G03F 7/0007* (2013.01); *B32B 27/06* (2013.01); *B32B 27/28* (2013.01); *C08G 77/44* (2013.01);
(Continued)

(58) Field of Classification Search
None
See application file for complete search history.

(56) References Cited

U.S. PATENT DOCUMENTS 3,294,737 A * 12/1966 Krantz ................... C08G 77/00
516/199
4,057,439 A * 11/1977 Lindmayer ............ H01L 31/048
136/251
(Continued)

FOREIGN PATENT DOCUMENTS

CN    102757650 A    10/2012
EP    2093804 A1    8/2009
(Continued)

OTHER PUBLICATIONS

English Translation of CN Office Action CN2013-80063401.5 dated Mar. 31, 2016.
(Continued)

*Primary Examiner* — Peter A Salamon
(74) *Attorney, Agent, or Firm* — Matthew T. Fewkes

(57) ABSTRACT

An optical assembly includes an optical device having an optical surface. The optical assembly further includes an encapsulant that substantially covers the optical surface. The encapsulant has a first layer (106) and a second layer (108). The first layer (106) has a first silicone-containing hot melt composition and a major surface (112). The second layer (108) has a second silicone-containing hot melt composition, the second layer (108) having a second major surface (110) in contact with the first major surface (112).

8 Claims, 9 Drawing Sheets

(51) Int. Cl.

| | | |
|---|---|---|
| *C08G 77/44* | (2006.01) | |
| *G03F 7/00* | (2006.01) | |
| *B32B 27/06* | (2006.01) | |
| *H01L 33/54* | (2010.01) | |
| *B32B 27/28* | (2006.01) | |
| *C08G 77/04* | (2006.01) | |
| *C08G 77/12* | (2006.01) | |
| *C08G 77/20* | (2006.01) | |

(52) U.S. Cl.
CPC .............. *C08L 83/04* (2013.01); *H01L 33/54* (2013.01); *H01L 33/56* (2013.01); *B32B 2457/206* (2013.01); *B32B 2551/00* (2013.01); *C08G 77/045* (2013.01); *C08G 77/12* (2013.01); *C08G 77/20* (2013.01); *H01L 2224/48091* (2013.01); *H01L 2224/73265* (2013.01); *H01L 2224/8592* (2013.01); *H01L 2924/181* (2013.01); *H01L 2933/005* (2013.01)

(56) References Cited

U.S. PATENT DOCUMENTS

| | | | |
|---|---|---|---|
| 4,116,207 A * | 9/1978 | Dominguez | H01L 31/048 136/251 |
| 4,139,399 A * | 2/1979 | Lindmayer | H01L 31/048 136/251 |
| 5,650,019 A * | 7/1997 | Yamada | H01L 31/048 136/251 |
| 6,204,443 B1 * | 3/2001 | Kiso | B32B 17/10788 126/621 |
| 6,706,960 B2 * | 3/2004 | Shiotsuka | C09D 133/04 136/246 |
| 7,294,861 B2 | 11/2007 | Schardt et al. | |
| 7,373,060 B2 | 5/2008 | Satake et al. | |
| 7,655,486 B2 | 2/2010 | Thompson et al. | |
| 7,705,093 B2 | 4/2010 | Kashiwagi et al. | |
| 7,858,198 B2 | 12/2010 | Kashiwagi et al. | |
| 7,859,006 B2 | 12/2010 | Kato et al. | |
| 8,013,345 B2 | 9/2011 | Barnes et al. | |
| 8,017,246 B2 * | 9/2011 | Morita | C08G 77/20 427/162 |
| 8,141,384 B2 | 3/2012 | Barnes et al. | |
| 8,178,642 B2 * | 5/2012 | Morita | C08G 77/50 525/100 |
| 8,847,063 B2 * | 9/2014 | Terreau | B32B 17/10018 136/251 |
| 8,877,877 B2 * | 11/2014 | Koh | C08L 83/04 525/100 |
| 8,921,495 B2 | 12/2014 | Horstman et al. | |
| 2007/0176317 A1 | 8/2007 | Morita et al. | |
| 2008/0021136 A1 | 1/2008 | Kashiwagi et al. | |
| 2009/0225640 A1 | 9/2009 | Manabe et al. | |
| 2010/0272673 A1 * | 10/2010 | Horstman | A61K 8/893 424/78.37 |
| 2011/0032708 A1 | 2/2011 | Johnston et al. | |
| 2011/0079816 A1 | 4/2011 | Fujioka et al. | |
| 2011/0210371 A1 | 9/2011 | Kimura et al. | |
| 2011/0298004 A1 | 12/2011 | Matsuda et al. | |
| 2012/0028388 A1 | 2/2012 | Katayama et al. | |
| 2012/0065343 A1 | 3/2012 | Bahadur et al. | |
| 2012/0070921 A1 | 3/2012 | Thompson et al. | |
| 2012/0083056 A1 | 4/2012 | Shinbori et al. | |
| 2012/0126282 A1 * | 5/2012 | Tanikawa | H01L 23/296 257/100 |

FOREIGN PATENT DOCUMENTS

| | | |
|---|---|---|
| JP | 2011138985 A | 7/2011 |
| WO | 2006059828 | 6/2006 |
| WO | 2007005417 A1 | 1/2007 |
| WO | 2007120197 A2 | 10/2007 |
| WO | 2013109607 A1 | 7/2013 |
| WO | 2013119796 A1 | 8/2013 |
| WO | 2014100656 A1 | 6/2014 |

OTHER PUBLICATIONS

PCT/US2013/077064 International Search Report dated Apr. 17, 2014.

* cited by examiner

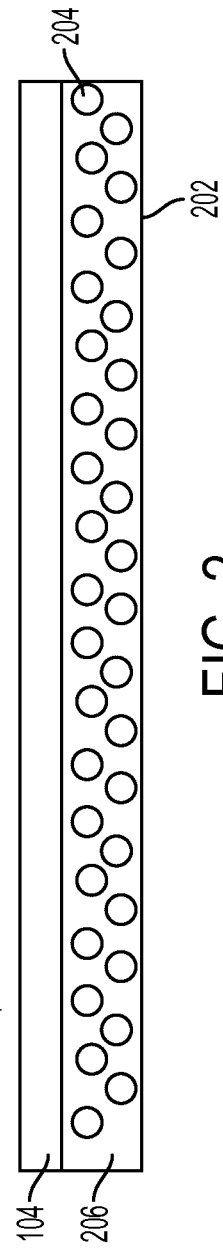

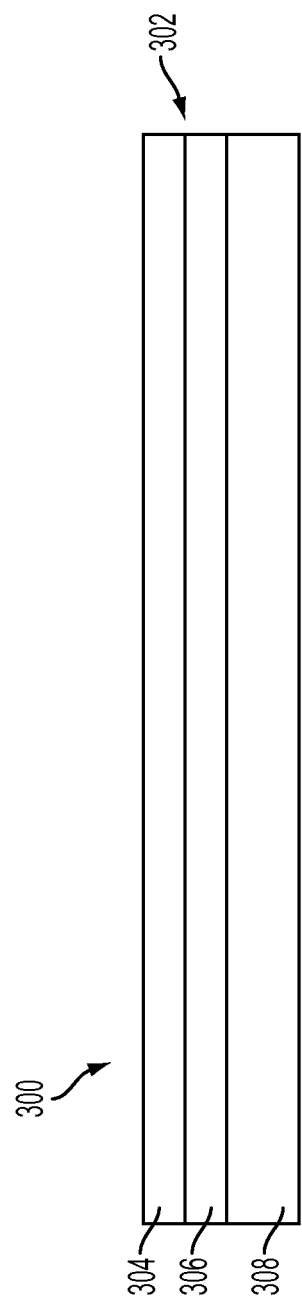

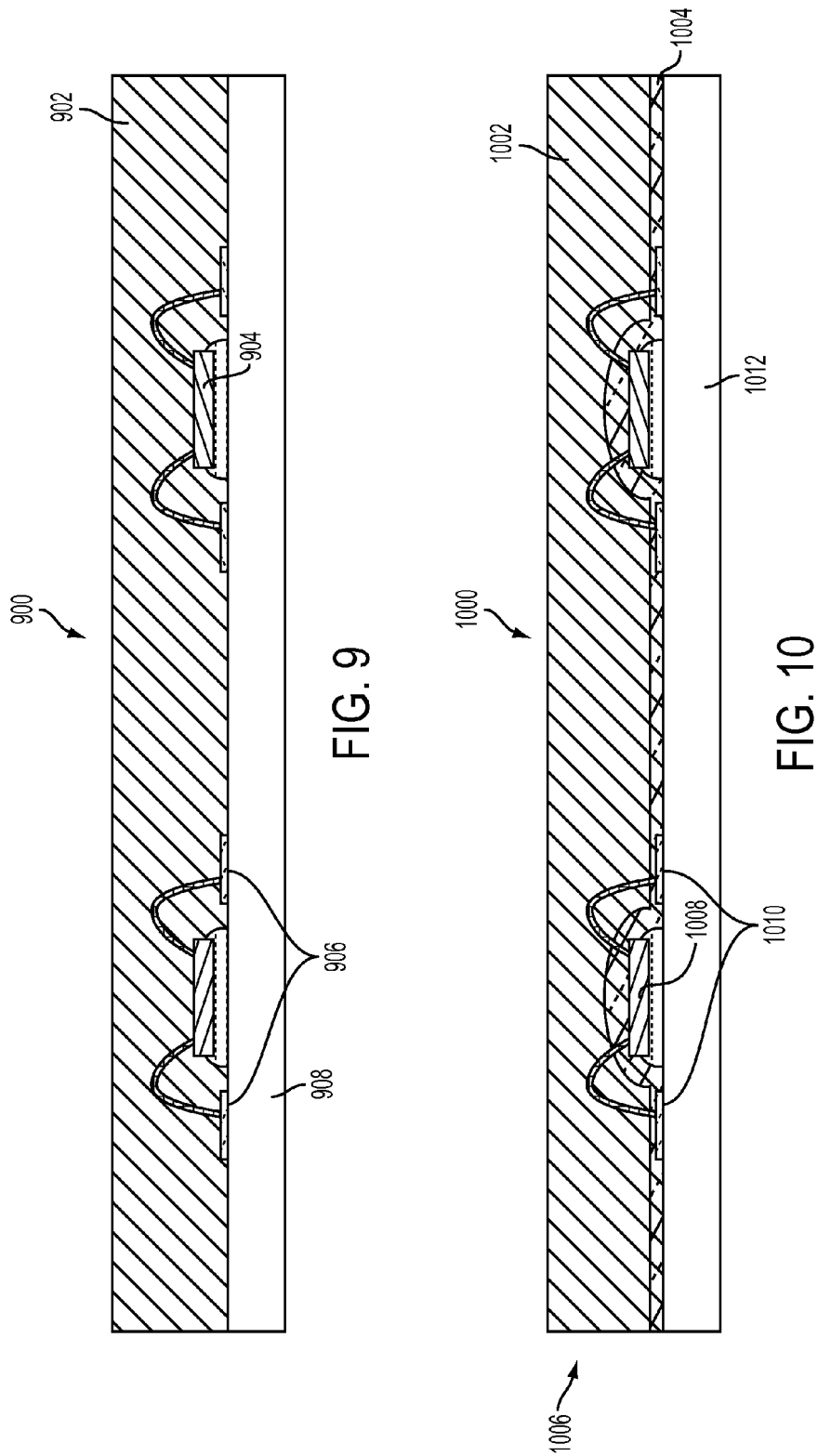

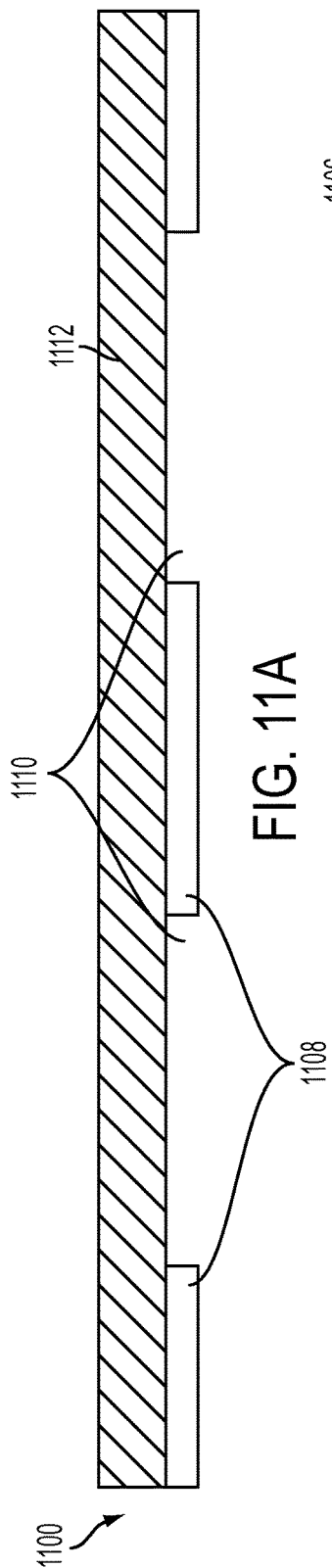
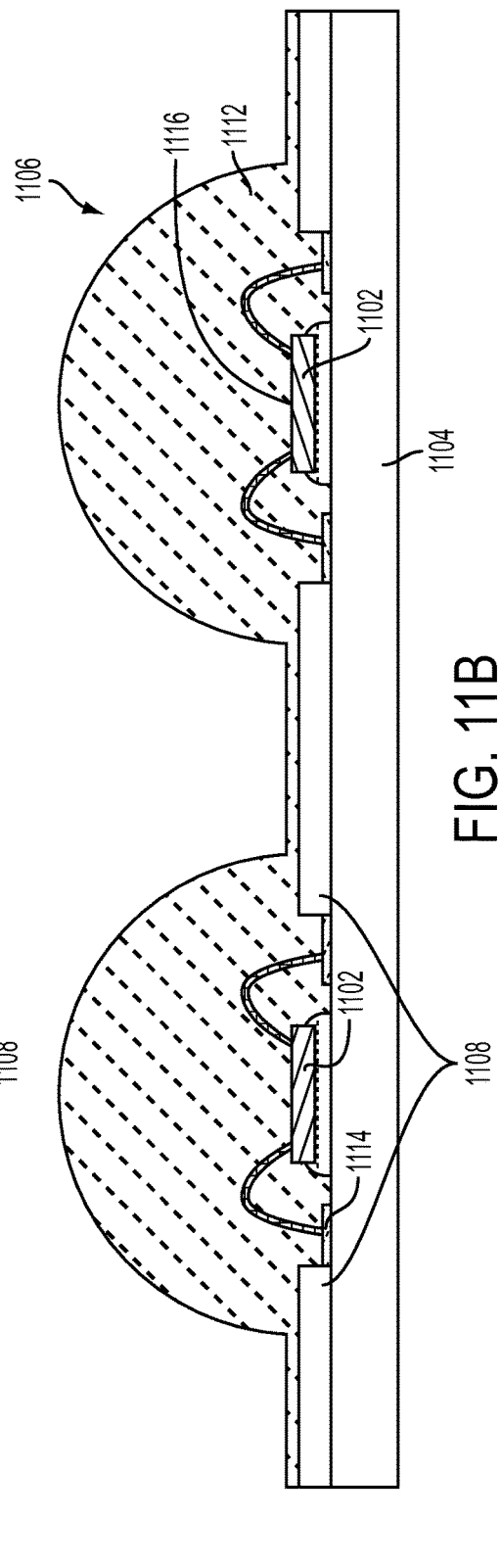

LAYERED POLYMER STRUCTURES AND METHODS

This application claims the benefit of priority to U.S. Provisional Appl. Ser. No. 61/740,867, filed Dec. 21, 2012, the entirety of which is incorporated by reference as if fully set forth herein.

This disclosure generally relates to a layered polymer structures and associated methods.

Optical devices, such as optical emitters, optical detectors, optical amplifiers, and the like, may emit or receive light via an optical surface. For various such devices, the optical surface may be or may include an electronic component or other component that may be sensitive to environmental conditions (e.g., rain, snow, and heat). Certain optical devices such as optoelectronics generally, including light emitting diodes (LEDs), laser diodes, and photosensors, can include solid state electronic components that may be susceptible to electrical shorts or other damage from environmental conditions if not protected. Even optical devices that may not be immediately susceptible may degrade over time if not protected. Accordingly, there is a need in the art for layered polymeric structures that, among other things, protect optical devices from the environment in which they operate.

An optical assembly that includes one or more optical devices may utilize a layered polymeric structure as an encapsulant for protection from environmental factors, as a lens, as a source of phosphor, and for other purposes. Substances that may be utilized as a layered polymeric structure for an optical device may tend to degrade over time. While such layered polymeric structures may start relatively clear, for instance, deterioration may result in cloudiness, yellowing, or other color distortion, causing a reduction or distortion in light emitted or detected from the optical device. Other forms of breakdown, such as cracking, warping, and the like, may undermine operation and/or performance of the optical device.

Such layered polymeric structures, including some silicone-based layered polymeric structures, may rely on cure mechanisms that utilize catalysts, such as platinum catalysts. However, residual catalyst may limit the thermal stability and/or long term durability of such silicone-based layered polymeric structures.

SUMMARY

Various embodiments of the present invention relate to a layered polymeric structure, such as for use as an encapsulant in an optical assembly with respect to the optical surface of an optical device. The layered polymeric structure may include a first and a second layer. The various layers may be a silicone-containing hot melt composition. The layered polymeric structure may be a pre-formed encapsulant film comprising first and second layers, wherein each of the first and second layers independently comprises a silicone-containing hot melt composition.

FIGURES

FIG. 1 is a side profile of a layered polymeric structure, such as may be utilized as an encapsulant in an optical assembly.

FIG. 2 is a side profile of a layered polymeric structure incorporating a layer with phosphor.

FIG. 3 is a side view of a layered polymeric structure including three layers.

FIG. 9 is an example of an optical assembly.

FIG. 10 is an example of an optical assembly.

FIGS. 11A and 11B illustrate mating a multilayer composition with an optical device on a substrate to form an optical assembly.

DETAILED DESCRIPTION

Figure 4:
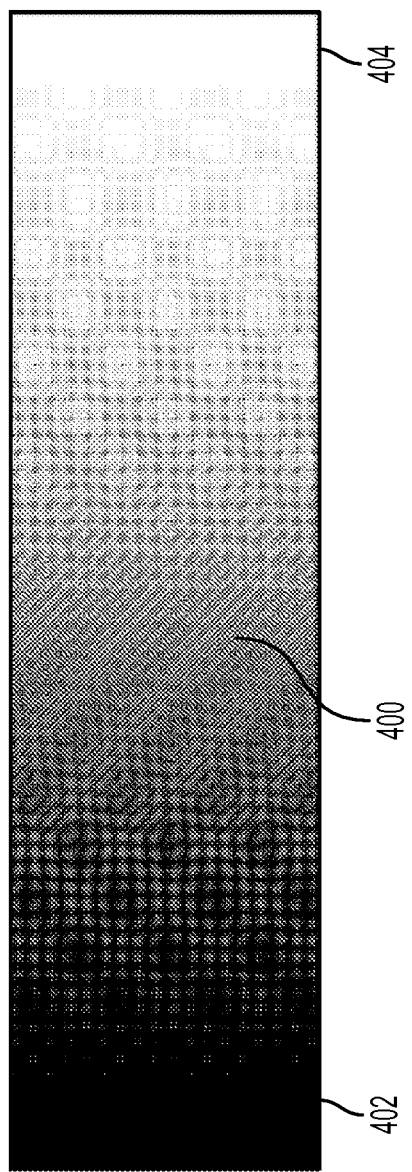
FIG. 4 is an example of a two-dimensional gradient in an exemplary layer.

The term "hot-melt," as used herein, generally refers to a material that is solid at or below room temperature or at or below the use temperature and becomes a melt (e.g., a material that is characterized by a viscosity or can be otherwise deformed without completely reverting to its original dimensions at higher temperatures such as 80° C. to 150° C.).

"Hot-melt" compositions of the various examples and embodiments described herein may be reactive or unreactive. Reactive hot melt materials and compositions are chemically curable thermoset products which, after curing, are high in strength and resistant to flow (i.e., high viscosity) at room temperature. Non-limiting examples of reactive hot melt compositions include compositions containing alkenyl reactive groups including dimethylalkenylsiloxy-terminated dimethylpolysiloxanes; dimethylalkenylsiloxy-terminated copolymers of methylalkenylsiloxane and dimethylsiloxane; dimethylalkenylsiloxy-terminated copolymers of methylphenylsiloxane and dimethylsiloxane; dimethylalkenylsiloxy-terminated copolymers of methylphenylsiloxane, methylalkenylsiloxane, and dimethylsiloxane; dimethylalkenylsiloxy-terminated copolymers of diphenylsiloxane and dimethylsiloxane; dimethylalkenylsiloxy-terminated copolymers of diphenylsiloxane, methylalkenylsiloxane, and dimethylsiloxane; or any suitable combination of the foregoing. The viscosity of hot melt compositions tend to vary significantly with changes in temperature from being highly viscous at relatively low temperatures (e.g., at or below room temperature) to having comparatively low viscosities as temperatures increase towards a target temperature sufficiently higher than a working temperature, such as room temperature. In various examples, the target temperature is 200° C. Reactive or non-reactive hot melt compositions are generally applied to a substrate at elevated temperatures (e.g., temperatures greater than room temperature, for example greater than 50° C.) as the composition is significantly less viscous at elevated temperatures (e.g., at temperatures from about 50 to 200° C.) than at room temperature or thereabouts. In some cases, hot melt compositions are applied on to substrates at elevated temperatures as flowable masses and are then allowed to quickly "resolidify" merely by cooling. Other application methods include the application of sheets of hot melt material on, e.g., a substrate or superstrate, at room temperature, followed by heating.

In various examples, the layered polymeric structure includes a composition that is a solid (solid composition), e.g., at room temperature. In various other examples, the layered polymeric structure includes a composition having a refractive index greater than about 1.4. In still other examples, the layered polymeric structure includes an organosiloxane block copolymer. When the layered polymeric structure includes an organosiloxane block copolymer, the block copolymer has, in some examples, a weight average molecular weight of at least 20,000 g/mole. In some examples, the organosiloxane block copolymer may include 40 to 90 mole percent disiloxy units of the formula $[R^1{}_2SiO_{2/2}]$ arranged in linear blocks each having an average of from 10 to 400 disiloxy units $[R^1{}_2SiO_{2/2}]$ per linear block. In other examples, the organosiloxane block copolymer may also include 10 to 60 mole percent trisiloxy units of the formula $[R^2SiO_{3/2}]$ arranged in non-linear blocks each having a weight average molecular weight of at least 500 g/mol. In still other examples, the organosiloxane block copolymer may include 0.5 to 25 mole percent silanol groups [≡SiOH]. In these formulae, $R^1$ is independently a $C_1$ to $C_{30}$ hydrocarbyl and $R^2$ is independently a $C_1$ to $C_{20}$ hydrocarbyl. In addition, in various examples, at least 30% of the non-linear blocks may be crosslinked with another non-linear block. In other various examples, the non-linear blocks may be aggregated in nano-domains. In still other examples, each linear block of the organosiloxane block copolymer may be linked to at least one non-linear block. The layered polymeric structure may have improved thickness control in comparison with various layered polymeric structures known in the art.

FIG. 1 is a side profile of a layered polymeric structure 100, such as may be utilized as an encapsulant in an optical assembly (below).

In various embodiments, the layered polymeric structures include pre-formed encapsulant films. As used herein, the term "pre-formed encapsulant film" refers broadly to layered polymeric structures that are formed before they are used to cover an optical surface of an optical device, e.g., before they are, e.g., disposed on an optical surface of an optical device. Pre-formed encapsulant films can take any suitable form including the form of sheets of any suitable dimension or a tape of any suitable width and length. For example before it is used to cover the optical surface of the optical device, the pre-formed encapsulant film may be a freestanding film, sheet or tape. The term "pre-formed encapsulant film," however, does not include the forming of a first layer of a layered polymeric structure on, e.g., the optical surface of an optical device, followed by the forming of a second layer of a layered polymeric structure on top of the first layer of the layered polymer structure, and so on.

The layered polymeric structure 100 includes a body 102 that may include a silicone-containing hot-melt composition, such as is described in detail herein. The body 102 may incorporate multiple layers of silicone-containing hot melt composition. The body 102 may include phosphors and may be formed so as to create a gradient (e.g., a gradient across each individual layer of a layered polymeric structure) of various characteristics. In various examples, the layered polymeric structure 100 is between about 0.5 μm and 5000 μm thick. In various examples, the body 102 and one or more layers that may make up the body may include at least one of a resin-linear composition, a hydrosilylation cure composition, a high-phenyl-T composition, a silicon sealant composition, a polyurea-polysiloxane composition, an MQ/polysiloxane composition, an MQ/X-diorganosiloxane composition, a polyimide-polysiloxane composition, a polycarbonate-polysiloxane composition, a polyurethane-polysiloxane composition, a polyacrylate-polysiloxane composition or a polyisobutylene-polysiloxane composition. In some embodiments, polycarbonate and polycarbonate-siloxane copolymer mixtures are contemplated.

With further respect to FIG. 1, the layered polymeric structure 100 may also include or, in various examples, be attached to a release liner 104. The release liner 104 may include a release agent for the promotion of securing the layered polymeric structure 100 to another object, such as an optical device. In various examples, the release liner 104 is or includes siliconized PET or a fluorinated liner. In various examples, the release liner 104 is smooth or is textured, such as to act as an anti-reflective surface.

With further respect to FIG. 1, the layered polymeric structure 100 that includes a first layer 106 and a second layer 108 in the body 102. In various examples, the first layer 106 and the second layer 108 are both silicone-containing hot melt compositions, but which, in various examples, include different chemistries. As will be disclosed in detail herein, such different chemistries may be relatively minor between layers 106, 108 or may incorporate significant differences. In various examples disclosed herein, the first layer has material properties, such as a modulus, a hardness, a refractive index, a light transmittance or a thermal conductivity that are different from that of the second layer.

With further respect to FIG. 1, the layers 106, 108 may each have a first major surface 110 and a second major surface 112 opposite the first major surface 110. Removal or non-incorporation of the release liner 104 may provide for the first layer 106 to have a first major surface 110 that is or may be exposed to environmental conditions (e.g., not covered by any additional layers and, as such, exposed to the outdoor environment, including rain, snow, and heat). The first major surface 110 of the first layer may be rough or roughened, in whole or in part, or may substantially repel dust, such as dust that may come from the environment (outdoor or indoor) or from within an optical assembly (e.g., photovoltaic panels and other optical energy-generating devices, optocouplers, optical networks and data transmission, instrument panels and switches, courtesy lighting, turn and stop signals, household appliances, VCR/DVD/stereo/audio/video devices, toys/games instrumentation, security equipment, switches, architectural lighting, signage (channel letters), machine vision, retail displays, emergency lighting, neon and bulb replacement, flashlights, accent lighting full color video, monochrome message boards, in traffic, rail, and aviation applications, in mobile phones, personal digital assistants (PDAs), digital cameras, lap tops, in medical instrumentation, bar code readers, color & money sensors, encoders, optical switches, fiber optic communication, and combinations thereof).

With further respect to FIG. 1, the layers 106, 108 can be secured with respect to one another through various processes disclosed herein, including lamination and through the use of catalysts. The first and second layers may be individually cured or not cured as appropriate to the particular compositions used therein. In an example, only one of the layers 106, 108 is cured, while the other one of the layers 106, 108 may set without curing. In an example, each of the first and second layers 106, 108 are cured, but cure at different cure speeds. In various examples, each of the first and second layers 106, 108 have the same or different curing mechanisms. In an example, at least one of the curing mechanisms of the layers 106, 108 include a hot melt cure, moisture cure, a hydrosilylation cure (as described above), a condensation cure, peroxide/radical cure, photo cure or a click chemistry-based cure that involves, in some examples, metal-catalyzed (copper or ruthenium) reactions between an azide and an alkyne or a radical-mediated thiol-ene reactions.

With further respect to FIG. 1, the curing mechanisms of the layers 106,108 may include combinations of one or more cure mechanisms within the same layer 106 or 108 or in each layer 106 or 108. For example, the curing mechanism within the same layer 106 or 108 may include a combination of a hydrosilylation and a condensation cure, where the hydrosilylation occurs first and is followed by the condensation cure (see below) or vice versa (e.g., hydrosilylation/alkoxy or alkoxy/hydrosilylation); a combination of a ultra-violet photo cure and a condensation cure (e.g., UV/alkoxy); a combination of a silanol and an alkoxy cure; a combination of a silanol and hydrosilylation cure; or a combination of an amide and a hydrosilylation cure.

With further respect to FIG. 1, the first and second layers 106, 108 can utilize first and second curing catalysts, such as may be incompatible with one another. In some examples, such an arrangement would cause the catalysts to "poison" each other such that there is an incomplete cure at the interface between the first layer 106 and the second layer 108. In various examples, the first layer 106 and second layer 108 individually selectably have reactive or non-reactive silicone-containing hot melt compositions.

With further respect to FIG. 1, in some examples, the first and second layers 106, 108 include Ph-T-PhMe in one layer and Ph-T-PhMe in the other layer. In some examples, one of the Ph-T-PhMe layers is a high refractive index Ph-T-PhMe layer. As used herein, the term "high refractive index" refers to refractive indices of from about 1.5 to about 1.58, e.g., from about 1.55 to about 1.58 or from about 1.56 to about 1.58. In other examples, one of the Ph-T-PhMe layers is cured. In some examples, one of the Ph-T-PhMe layers has a thickness of from about 50 to about 100 microns (e.g., from about 50 to about 75 microns; from about 60 to about 90 microns; or from about 75 to about 100 microns). In other examples, one of the Ph-T-PhMe layers has a thickness of from about 0.3 to about 1.5 mm (e.g., from about 0.5 to about 1.3 mm; from about 1 to about 1.5 mm; or from about 0.75 to about 1.5 mm). In still other examples, In yet other examples, one of the Ph-T-PhMe includes a phosphor.

With further respect to FIG. 1, in some examples, the first and second layers 106, 108 include Ph-T-PhMe in one layer and Ph-T-PDMS in the other layer. In some examples, the Ph-T-PhMe layers is a high refractive index Ph-T-PhMe layer. In some examples, the Ph-T-PhMe layer has a thickness of from about 50 to about 100 microns (e.g., from about 50 to about 75 microns; from about 60 to about 90 microns; or from about 75 to about 100 microns). In other examples, the Ph-T-PDMS layer has a thickness of from about 0.3 to about 1.5 mm (e.g., from about 0.5 to about 1.3 mm; from about 1 to about 1.5 mm; or from about 0.75 to about 1.5 mm). In yet other examples, the Ph-T-PhMe layer includes a phosphor.

With further respect to FIG. 1, in some examples, the first and second layers 106, 108 include Ph-T-PhMe in one layer and MQ/-PDMS in the other layer. In some examples, the Ph-T-PhMe layer is a high refractive index Ph-T-PhMe layer. In some examples, the Ph-T-PhMe layer has a thickness of from about 50 to about 100 microns (e.g., from about 50 to about 75 microns; from about 60 to about 90 microns; or from about 75 to about 100 microns). In other examples, the MQ/PDMS layer has a thickness of from about 0.3 to about 1.5 mm (e.g., from about 0.5 to about 1.3 mm; from about 1 to about 1.5 mm; or from about 0.75 to about 1.5 mm). In yet other examples, the Ph-T-PhMe layer includes a phosphor.

With further respect to FIG. 1, in some examples, the first and second layers 106, 108 include Ph-T-PhMe in one layer and Np-T-PhMe in the other layer. In some examples, the Ph-T-PhMe layers is a high refractive index Ph-T-PhMe layer. In some examples, the Np-T-PhMe layer is an ultra-high refractive index Np-T-PhMe layer. As used herein, the term "ultra-high refractive index" refers to refractive indices greater than 1.58, e.g., greater than 1.65, greater than 1.75; from about 1.6 to about 2.5; from about 1.75 to about 2; or from about 1.65 to about 2. In other examples, the Ph-T-PhMe layer has a thickness of from about 0.3 to about 1.5 mm (e.g., from about 0.5 to about 1.3 mm; from about 1 to about 1.5 mm; or from about 0.75 to about 1.5 mm). In other examples, the Np-T-PhMe layer has a thickness of from about 50 to about 100 microns (e.g., from about 50 to about 75 microns; from about 60 to about 90 microns; or from about 75 to about 100 microns). In yet other examples, the Np-T-PhMe layer includes a phosphor.

With further respect to FIG. 1, the second layer 108 is or includes a phosphor within a silicone-containing hot melt composition.

The phosphor contemplated for use in the various embodiments described herein can be any suitable phosphor. In an example, the phosphor is made from a host material and an activator, such as copper-activated zinc sulfide and silver-activated zinc sulfide. The host material may be selected from a variety of suitable materials, such as oxides, nitrides and oxynitrides, sulfides, selenides, halides or silicates of zinc, cadmium, manganese, aluminum, silicon, or various rare earth metals, $Zn_2SiO_4$:Mn (Willemite); ZnS:Ag+(Zn,Cd)S:Ag; $ZnS$:Ag+$ZnS$:Cu+$Y_2O_2S$:Eu; ZnO:Zn; KCl; ZnS:Ag,Cl or ZnS:Zn; $(KF,MgF_2)$:Mn; (Zn,Cd)S:Ag or (Zn,Cd)S:Cu; $Y_2O_2S$:Eu+$Fe_2O_3$, ZnS:Cu,Al; ZnS:Ag+Co-on-$Al_2O_3$; $(KF,MgF2)$:Mn; (Zn,Cd)S:Cu,Cl; ZnS:Cu or ZnS:Cu,Ag; $MgF_2$:Mn; $(Zn,Mg)F_2$:Mn; $Zn_2SiO_4$:Mn,As; ZnS:Ag+(Zn,Cd)S:Cu; $Gd_2O_2S$:Tb; $Y_2O_2S$:Tb; $Y_3Al_5O_{12}$:Ce; $Y_2SiO_5$:Ce; $Y_3Al_5O_{12}$:Tb; ZnS:Ag,Al; ZnS:Ag; ZnS:Cu,Al or ZnS:Cu,Au,Al; (Zn,Cd)S:Cu,Cl+(Zn,Cd)S:Ag,Cl; $Y_2SiO_5$:Tb; $Y_2OS$:Tb; $Y_3(Al,Ga)_5O_{12}$:Ce; $Y_3(Al,Ga)_5O_{12}$:Tb; $InBO_3$:Tb; $InBO_3$:Eu; $InBO_3$:Tb+$InBO_3$:Eu; In $BO_3$:Tb+In $BO_3$:Eu+ZnS:Ag; $(Ba,Eu)Mg_2Al_{16}O_{27}$; (Ce,Tb)$MgAl_{11}O_{19}$; BaMg $Al_{10}O_{17}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce,Tb; $Zn_2SiO_4$:Mn,$Sb_2O_3$; $CaSiO_3$:Pb,Mn; $CaWO_4$ (Scheelite); $CaWO_4$:Pb; $MgWO_4$; $(Sr,Eu,Ba,Ca)_5(PO_4)_3Cl$; $Sr_5Cl(PO_4)_3$:Eu(II); $(Ca,Sr,Ba)_3(PO_4)_2Cl_2$:Eu; $(Sr,Ca,Ba)_{10}(PO_4)_6C_{12}$:Eu; $Sr_2P_2O_7$:Sn(II); $Sr_6P_5BO_{20}$:Eu; $Ca_5F(PO_4)_3$:Sb; $(Ba,Ti)_2P_2O_7$:Ti; $3Sr_3(PO_4)_2.SrF_2$:Sb,Mn; $Sr_5F(PO_4)_3$:Sb,Mn; $Sr_5F(PO_4)_3$:Sb,Mn; $LaPO_4$:Ce,Tb; $(La,Ce,Tb)PO_4$; $(La,Ce,Tb)PO_4$:Ce,Tb; $Ca_3(PO_4)_2CaF_2$:Ce,Mn; $(Ca,Zn,Mg)_3(PO_4)_2$:Sn; $(Zn,Sr)_3(PO_4)_2$:Mn; $(Sr,Mg)_3(PO_4)_2$:Sn; $(Sr,Mg)_3(PO_4)_2$:Sn(II); $Ca_5F(PO_4)_3$:Sb,Mn; $Ca_5(F,Cl)(PO_4)_3$:Sb,Mn; $(Y,Eu)_2O_3$; $Y_2O_3$:Eu(III); $Mg_4(F)GeO_6$:Mn; $Mg_4(F)(Ge,Sn)O_6$:Mn; $Y(P,V)O_4$:Eu; $YVO_4$:Eu; $Y_2O_2S$:Eu; 3.5 MgO.0.5 $MgF_2.GeO_2$:Mn; $Mg_5As_2O_{11}$:Mn; $SrAl_2O_7$:Pb; $LaMgAl_{11}O_{19}$:Ce; $LaPO_4$:Ce; $SrAl_{12}O_{19}$:Ce; $BaSi_2O_5$:Pb; $SrFB_2O_3$:Eu(II); $SrB_4O_7$:Eu; $Sr_2MgSi_2O_7$:Pb; $MgGa_2O_4$:Mn(II); $Gd_2O_2S$:Tb; $Gd_2O_2S$:Eu; $Gd_2O_2S$:Pr; $Gd_2O_2S$:Pr,Ce,F; $Y_2O_2S$:Tb; $Y_2O_2S$:Eu; $Y_2O_2S$:Pr; Zn(0.5)Cd(0.4)S:Ag; Zn(0.4)Cd(0.6)S:Ag; $CdWO_4$; $CaWO_4$; $MgWO_4$; $Y_2SiO_5$:Ce; $YAlO_3$:Ce; $Y_3Al_5O_{12}$:Ce; $Y_3(Al,Ga)_5O_{12}$:Ce; CdS:In; ZnO:Ga; ZnO:Zn; (Zn,Cd)S:Cu,Al; ZnS:Cu,Al,Au; ZnCdS:Ag,Cu; ZnS:Ag; anthracene, EJ-212, Zn2SiO4:Mn; ZnS:Cu; NaI:Tl; CsI:Tl; LiF/ZnS:Ag; LiF/ZnSCu,Al,Au, and combinations thereof.

With further respect to FIG. 1, in various examples, the phosphor may be dispersed in the second layer 108. Additionally or alternatively, the phosphor may be dispersed in a discrete layer, e.g., the phosphor may be present in a layer independent from a solid composition or may be combined with another composition, such as the silicone-containing hot melt composition.

With further respect to FIG. 1, the layers 106, 108 may be configured in a variety of orientations with respect to one another and the release layer 104. In various examples of layered polymeric structures, the same materials may be utilized in variously-ordered layers to create desired effects with respect to light passing therethrough. Thus, various encapsulants for various optical devices disclosed herein and known in the art may have layers that, in addition to the specific materials utilized therein, may also utilize specific layer ordering depending on particular optical devices. In various examples, specific encapsulants may be generally applicable among various optical devices. However, other optical devices may advantageously utilize encapsulants that are unique in terms of the materials utilized and/or the ordering of layers, among other possible variations.

With further respect to FIG. 1, the one or more layers 106, 108 may include a gradient. In an example, the gradient may be of the silicone-containing hot melt composition and/or of a phosphor. The gradient may be continuous (e.g., uninterrupted and/or consistently changing) or stepped, e.g., discontinuous or changing in one or more steps. In various examples, the stepped gradient can reflect different layers between steps. The term "gradient" may describe a graded change in the amount of components of, for instance, the silicone-containing hot melt composition and/or the amounts of the phosphor. The gradient may also describe a graded change in the magnitude of the light produced by the phosphor.

With further respect to FIG. 1, in one example, the gradient may be further defined as a vector field which points in the direction of the greatest rate of increase and whose magnitude is the greatest rate of change. In another example, the gradient may be further defined as a series of two-dimensional vectors at points on the silicone-containing hot melt composition and/or phosphor with components given by the derivatives in horizontal and vertical directions. In an example, at each point the vector points in the direction of a largest increase, and the length of the vector corresponds to the rate of change in that direction With further respect to FIG. 1, in an example, the composition comprises a gradient of disiloxy units and trisiloxy units. In another example, the composition includes a gradient of disiloxy units, trisiloxy units, and silanol groups. In still another example, the composition includes a gradient of trisiloxy units and silanol groups. In a further example, the composition includes a gradient of disiloxy units and silanol groups. In addition, silicone compositions ranging in refractive index can be used to prepare a composition gradient. For example, a phenyl-T-PDMS resin-linear with refractive index of 1.43 can be combined with a phenyl-T-PhMe resin-linear with a refractive index of 1.56 to create a gradient. Such an example may provide a relatively smooth transition from a high refractive index optical device, such as an LED, to an air surface.

With further respect to FIG. 1, in the illustrated example, the gradient creates a relatively harder composition proximate release layer 104 and a relatively softer composition distal of the release layer 104. Such an example of a layered polymeric structure 100 may, in various examples, be utilized, for instance, to present a relatively soft surface to an optical surface of an optical device that includes relatively sensitive electronic components, such as an LED. At the same time, the relatively hard surface of the layer 106, 108 that forms a gradient may be exposed to environmental conditions may provide useful resiliency for the resultant optical assembly. In various alternative examples, the side of the layered polymeric structure 100 that is exposed to environmental conditions may advantageously be relatively softer than the internal conditions, dependent on the particular circumstances of its use. In an example, the first layer 106 includes a phosphor and the second layer 108 includes the composition that has a gradient.

FIG. 2 is a side profile of an layered polymeric structure 200 incorporating a layer 202 with phosphor 204 in combination with the silicone-containing hot melt composition 206. While the illustrated example shows only one layer 202 for the purposes of illustration, any number of additional layers may be included as appropriate. A release layer 104 is also included in the illustrated example. As illustrated, the phosphor is dispersed generally evenly throughout the composition 206. In various examples, the phosphor 204 can be established in a gradient pattern, homogeneously dispersed throughout the composition 206, or present in higher concentrations in some areas of the composition 206 and in lower concentration in other areas of the composition 206.

With further respect to FIG. 2, in an example, the layer 202 includes a phosphor 204 combined with the composition 206 that includes a gradient. In the illustrated example, the phosphor 204 is generally evenly distributed while the composition 206 forms the gradient. In various alternative examples, the distribution of the phosphor 204 may create a gradient either in place of or in addition to the gradient in the composition 206.

FIG. 3 is a side view of a layered polymeric structure 300 that includes a body 302 having a first layer 306, a second layer 308, and a third layer 310. In the illustrated example, the first layer 306 includes a first phosphor to make the first layer 306 modify light passing therethrough according to a wavelength corresponding to a first color. The second layer 308 includes a second phosphor to make the second layer 308 modify light passing therethrough according to a wavelength corresponding to a second color. In an example, the first and second colors are yellow and red, respectively, though in various examples the colors are selectable based on the characteristics of the optical device with which the layered polymeric structure 300 is to be associated. The third layer 310 can include the silicone-containing hot melt composition and can be selected to not purposefully distort light. As noted above, the ordering of the layers 306, 308, 310 may be selected dependent on the characteristics of an associated optical device. In an example, the third layer 310 is configured to be placed on an optical surface of the optical device and may include an adhesive to adhere, at least in part, the layered polymeric structure 300 with respect to the optical device and the optical surface.

With further respect to FIG. 3, in various examples, the third layer 310 is an organic polymer. The organic polymer excludes silicon-containing hot melt compositions as the term "silicon-containing hot melt compositions" is defined herein. The organic polymer may be or may include an acrylic polymer, a polycarbonate, an alkylene polymer or an alkylene-acrylic copolymer. The alkylene polymer may be poly-isobutylene or polyvinyl fluoride. The alkylene-acrylic copolymer may be an ethylene-vinyl acetate copolymer. The organic polymer may be a plastic-based carrier. The plastic-based carrier may be polyisobutylene, polyethylene terephthalate, polypropylene, high-density polyethylene, low-density polyethylene, polypropylene, or combinations thereof.

With further respect to FIG. 3, in some examples, the first, second, and third layers 306, 308, 310 include Np-T-PhMe in one layer, Ph-T-PhMe in another layer, and Ph-T-PhMe in the last layer. In some examples, one of the Ph-T-PhMe layers is a high refractive index Ph-T-PhMe layer. In other examples, one of the Ph-T-PhMe layers is cured. In some examples, one of the Ph-T-PhMe layers has a thickness of from about 50 to about 100 microns (e.g., from about 50 to about 75 microns; from about 60 to about 90 microns; or from about 75 to about 100 microns). In other examples, one of the Ph-T-PhMe layers has a thickness of from about 0.3 to about 1.5 mm (e.g., from about 0.5 to about 1.3 mm; from about 1 to about 1.5 mm; or from about 0.75 to about 1.5 mm). In other examples, the Np-T-PhMe layer has a thickness of from about 1 to about 20 microns (e.g., from about 1 to 10 microns; from about 10 to about 15 microns; or from about 10 microns to about 20 microns). In yet other examples, the Ph-T-PhMe layer includes a phosphor.

With further respect to FIG. 3, in some examples, the first, second, and third layers 306, 308, 310 include Ph-T-PhMe in one layer, MQ/PDMS in another layer, and an organic polymer in the last layer. In some examples, the Ph-T-PhMe layer is a high refractive index Ph-T-PhMe layer. In other examples, the Ph-T-PhMe layer has a thickness of from about 50 to about 100 microns. In other examples, the MQ/PDMS layer has a thickness of from about 0.3 to about 1.5 mm. In still other examples, In other examples, the organic polymer layer has a thickness of from about 50 to about 100 microns. In yet other examples, the Ph-T-PhMe layer includes a phosphor.

With further respect to FIG. 3, various alternative examples of layered polymeric structures 100-300 are contemplated, including certain combinations of layers utilized therein. In an example, the layered polymeric structure 300 includes one layer 306 with a phosphor, one clear layer 308, and one layer 310 with a gradient in a reflective index. Various layered polymeric structures 100-300 can incorporate a glue, such as part of the release layer 104 or in addition to the depicted layers. In various examples, the glue can contribute to curing, such as for a phosphor layer.

FIG. 4 is an example of a two-dimensional gradient in an exemplary layer 400. The gradient creates a relatively harder silicone-containing hot melt composition at a first end 402 of the layer 400 than at a second end 404. The illustrative example can apply equally well to other gradients in other layers disclosed herein.

The optical assemblies disclosed herein may have various architectures. For example, the optical assembly may include only an optical device and a layered polymeric structure acting as an encapsulant with a body (e.g., the body 102 of FIG. 1). Alternatively, the optical assembly may include only an optical device and a layered polymeric structure acting as an encapsulant with a body (e.g., the body 102 of FIG. 1) and may further include a release liner (e.g., the release liner 104 of FIG. 1) disposed on or with respect to the encapsulant and/or the optical device.

The optical assembly may be in various known applications, such as in photovoltaic panels and other optical energy-generating devices, optocouplers, optical networks and data transmission, instrument panels and switches, courtesy lighting, turn and stop signals, household appliances, VCR/DVD/ stereo/audio/video devices, toys/games instrumentation, security equipment, switches, architectural lighting, signage (channel letters), machine vision, retail displays, emergency lighting, neon and bulb replacement, flashlights, accent lighting full color video, monochrome message boards, in traffic, rail, and aviation applications, in mobile phones, personal digital assistants (PDAs), digital cameras, lap tops, in medical instrumentation, bar code readers, color & money sensors, encoders, optical switches, fiber optic communication, and combinations thereof.

The optical devices can include coherent light sources, such as various lasers known in the art, as well as incoherent light sources, such as light emitting diodes (LED) and various types of light emitting diodes, including semiconductor LEDs, organic LEDs, polymer LEDs, quantum dot LEDs, infrared LEDs, visible light LEDs (including colored and white light), ultraviolet LEDs, and combinations thereof.

The optical assembly may also include one or more layers or components known in the art as typically associated with optical assemblies. For example, the optical assembly may include one or more drivers, optics, heat sinks, housings, lenses, power supplies, fixtures, wires, electrodes, circuits, and the like.

The optical assembly may also include a substrate and/or a superstrate. The substrate and the superstrate may be the same or may be different and each may independently include any suitable material known in the art. The substrate and/or superstrate may be soft, flexible, rigid, or stiff. Alternatively, the substrate and/or superstrate may include rigid and stiff segments while simultaneously including soft and flexible segments. The substrate and/or superstrate may be transparent to light, may be opaque, or may not transmit light (i.e., may be impervious to light). A superstrate may transmit light. In one example, the substrate and/or superstrate includes glass. In another example, the substrate and/or superstrate includes metal foils, polyimides, ethylene-vinyl acetate copolymers, and/or organic fluoropolymers including, but not limited to, ethylene tetrafluoroethylene (ETFE), TEDLAR® (DuPont, Wilmington, Del.), polyester/TEDLAR®, TEDLAR®/polyester/TEDLAR®, polyethylene terephthalate (PET) alone or coated with silicon and oxygenated materials (SiOx), and combinations thereof. In one example, the substrate is further defined as a PET/SiOx-PET/Al substrate, wherein x has a value of from 1 to 4.

The substrate and/or superstrate may be load bearing or non-load bearing and may be included in any portion of the optical assembly. The substrate may be a "bottom layer" of the optical assembly that is positioned behind the optical device and serves, at least in part, as mechanical support for the optical device and the optical assembly in general. Alternatively, the optical assembly may include a second or additional substrate and/or superstrate. The substrate may be the bottom layer of the optical assembly while a second substrate may be the top layer and function as the superstrate. A second substrate (e.g., a second substrate functioning as a superstrate) may be substantially transparent to light (e.g., visible, UV, and/or infrared light) and is positioned on top of the substrate.

In addition, the optical assembly may also include one or more tie layers. The one or more tie layers may be disposed on the substrate to adhere the optical device to the substrate. In one example, the optical assembly does not include a substrate and does not include a tie layer. The tie layer may be transparent to UV, infrared, and/or visible light. However, the tie layer may be impermeable to light or opaque. The tie layer may be tacky and may be a gel, gum, liquid, paste, resin, or solid. In one example, the tie layer is a film.

Alternatively, the optical assembly may include the silicone-containing hot melt composition in a single layer or in multiple layers free of the release liner 104. In another example, the phosphor is present in a density gradient and the optical assembly includes a controlled dispersion of the phosphor. In this example, the controlled dispersion may be sedimented and/or precipitated. In still another example, the optical assembly may have a gradient of a modulus and/or of hardness in any one or more layers. In still another example, the optical assembly may include one or more gas barrier layers present in any portion of the optical assembly. The optical assembly may include one or more of a tackless layer, a non-dust layer, and/or a stain layer present in any portion of the optical assembly. The optical assembly may further include a combination of a B-stage film (e.g., an embodiment of the pre-formed encapsulant film) and include one or more layers of a non-melting film. The optical assembly may also include one or more hard layers, e.g., glass, polycarbonate, or polyethylene terephthalate, disposed within, e.g., on top, of the optical assembly. The hard layer may be disposed as an outermost layer of the optical assembly. The optical assembly may include a first hard layer as a first outermost layer and a second hard layer as a second outermost layer. The optical assembly may further include one or more diffuser infused layers disposed in any portion of the optical assembly. The one or more diffuser layers may include, for example, e-powder, $TiO_2$, $Al_2O_3$, etc. The optical assembly may include a reflector and/or the solid composition (e.g., as a film) may include reflector walls embedded therein. Any one or more of the layers of the solid state film may be smooth, may be patterned, or may include smooth portions and patterned portions. The optical assembly may alternatively include, for example instead of a phosphor, carbon nanotubes. Alternatively, carbon nanotubes may be aligned in a certain direction, for example on a wafer surface. A film can be cast around these carbon nanotubes to generate a transparent film with improved heat dissipation character.

Figure 5:
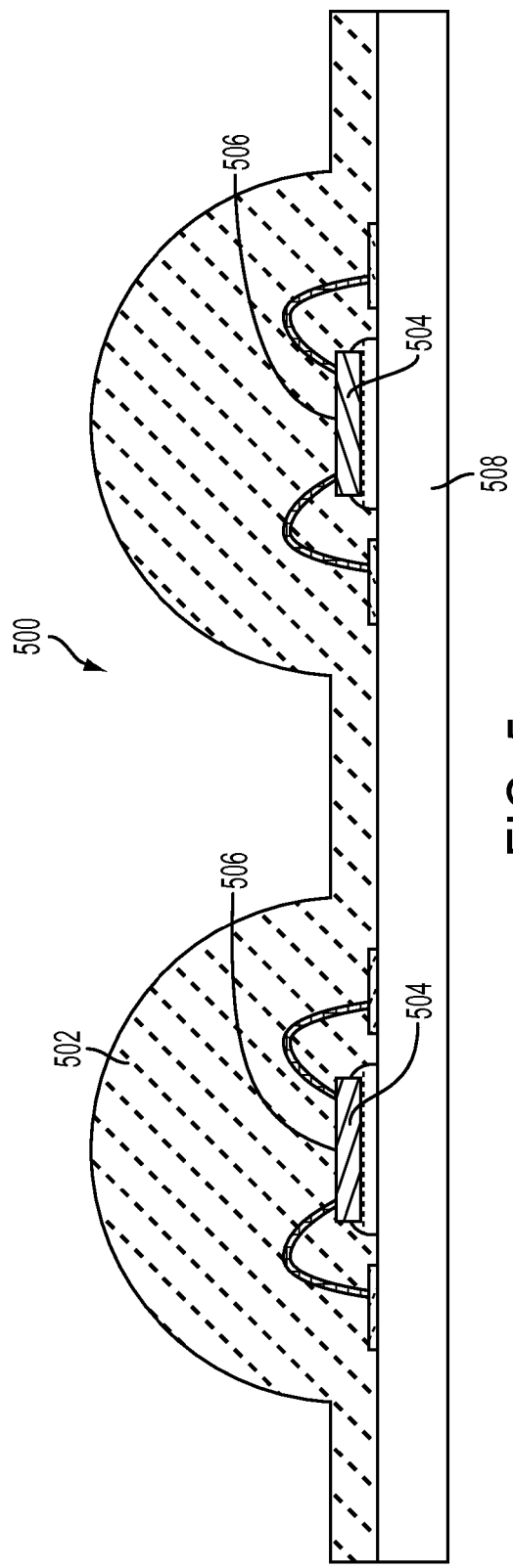
FIG. 5 is an example of an example of an optical assembly.

FIG. 5 is an image an example of an optical assembly 500. The optical assembly includes an encapsulant 502, optical devices 504 each having an optical surface 506 and each positioned on a substrate 508. A silicone composition of the encapsulant 502 may be heated at 100° C. for 30 minutes by hot-press with a 1 mm depth mold. A 1 mm thickness B-stage transparent sheet or layer may be incorporated. The encapsulant 502 may be compression molded to the optical devices 504, as illustrated in a mold with dome-shape cavities. A transparent sheet or layer may be incorporated in the encapsulant 502. The encapsulant 502 as incorporated into the optical assembly 500 may be obtained by compression molding at 130° C. for five (5) minutes to melt the encapsulant 502 and cure the encapsulant 502 in the dome-shape cavities.

With further respect to FIG. 5, the encapsulant 502 may be or may include a body with multiple layers as disclosed herein, such as the body 102 (FIG. 1) or the body 302 (FIG. 3). While various examples of optical assemblies are disclosed herein, the encapsulant 502 of the optical assembly 500 may be configured according to any of various combinations of layers of materials disclosed herein. Further, the optical device 504 may be any of the optical devices 504 disclosed herein or known in the art. As with other encapsulants disclosed herein, the encapsulant 502 substantially or entirely covers the optical surface 506 of the optical device 502.

The optical assemblies of the embodiments described herein include, among other things, an encapsulant. The encapsulant, in turn, includes a first layer comprising a first reactive or non-reactive silicone-containing hot melt composition; and a second layer comprising a second reactive or non-reactive silicone-containing hot melt composition. The first and/or second silicone-containing composition includes at least one of a resin-linear composition, a hydrosilylation cure composition, a high-phenyl-T composition, a silicon sealant composition, a polyurea-polysiloxane composition, an MQ/polysiloxane composition, an MQ/X-diorganosiloxane composition, a polyimide-polysiloxane composition, a polycarbonate-polysiloxane composition, a polyurethane-polysiloxane composition a polyacrylate-polysiloxane composition or a polyisobutylene-polysiloxane composition. In some embodiments, polycarbonate and polycarbonate-siloxane copolymer mixtures are contemplated. In other embodiments, compositions are contemplated where resin-linear organosiloxane block copolymer compositions, such as those described herein and those described in Published U.S. Appl. Nos. 2013/0168727 and 2013/0245187 (the entireties of both of which are incorporated by reference as if fully set forth herein) are combined with linear or resin organopolysiloxane components by, e.g., blending methods. Such compositions are described in U.S. Provisional Patent Appl. Ser. No. 61/613,510, filed Mar. 21, 2012. Such compositions exhibit improved toughness and flow behavior of the resin-linear organosiloxane block copolymer compositions with minimum impact, if any, on the optical transmission properties of cured films of resin-linear organosiloxane block copolymers.

As used herein, the term "resin-linear composition" includes organosiloxane block copolymer having an organosiloxane "resin" portion coupled to an organosiloxane "linear" portion. Resin-linear compositions are described in greater detail below. Resin-linear compositions also include those disclosed in U.S. Pat. No. 8,178,642, the entirety of which is incorporated by reference as if fully set forth herein. Briefly, the resin-linear compositions disclosed in the '642 patent include compositions containing: (A) a solvent-soluble organopolysiloxane resulting from the hydrosilylation reaction between an organopolysiloxane represented by the average structural formula $R_aSiO_{(4-a)/2}$ and a diorganopolysiloxane represented by the general formula $HR^2_2Si(R^2_2SiO)_nR^2_2SiH$; and (B) an organohydrogenpolysiloxane represented by the average structural formula $R^2_bH_cSiO$; and (C) a hydrosilylation catalyst, where the variables $R_a$, $R^2$, a, n, b, and c are defined therein.

As disclosed in detail herein, the resin-linear composition may include various characteristics. In certain resin-linear compositions, the composition includes a resin-rich phase and a phase separated linear-rich phase.

As used herein, the term "high-phenyl-T compositions" includes compositions obtained by crosslinking a phenyl group-containing organopolysiloxane represented by the average units formula:

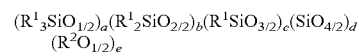

wherein $R^1$ is a phenyl group, alkyl or cycloalkyl group having 1 to 6 carbon atoms, or an alkenyl group having 2 to 6 carbon atoms, with the proviso that 60 to 80 mole % of $R^1$ are phenyl groups and 10 to 20 mole % of $R^1$ are alkenyl groups; $R^2$ is a hydrogen atom or an alky group having 1 to 6 carbon atoms; "a," "b," "c," "d," and "e" are numbers that are satisfied by the following conditions: $0 \leq a \leq 0.2$, $0.2 \leq b \leq 0.7$, $0.2 \leq c \leq 0.6$, $0 \leq d \leq 0.2$, $0 \leq e \leq 0.1$, and $a+b+c+d=1$.

The term "high-phenyl-T compositions" also includes compositions obtained by partially crosslinking a silicone composition including:

(A) a phenyl group-containing organopolysiloxane represented by the following average units formula:

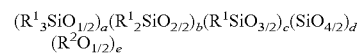

wherein R¹ is a phenyl group, alkyl or cycloalkyl group having 1 to 6 carbon atoms, or an alkenyl group having 2 to 6 carbon atoms, with the proviso that 60 to 80 mole % of R¹ are phenyl groups and 10 to 20 mole % of R¹ are alkenyl groups; R² is a hydrogen atom or an alky group having 1 to 6 carbon atoms; "a," "b," "c," "d," and "e" are numbers that are satisfied by the following conditions: 0≤a≤0.2, 0.2≤b≤0.7, 0.2≤c≤0.6, 0≤d≤0.2, 0≤e≤0.1, and a+b+c+d=1;

(B) a phenyl group-containing organopolysiloxane represented by the following general formula:

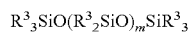

wherein R³ is a phenyl group, alkyl or cycloalkyl group having 1 to 6 carbon atoms, or an alkenyl group having 2 to 6 carbon atoms, with the proviso that 40 to 70 mole % of R³ are phenyl groups and at least one of R³ is a alkenyl group; "m" is an integer of 5 to 100;

(C) a phenyl group-containing organopolysiloxane having at least two silicon atom-bonded hydrogen atoms per molecule; and (D) a hydrosilylation reaction catalyst.

In some examples, component (C) is an organotrisiloxane represented by the general formula: $(HR^4{}_2SiO)_2SiR^4{}_2$ wherein R⁴ is a phenyl group, or alkyl or cycloalkyl group having 1 to 6 carbon atoms, with the proviso that 30 to 70 mole % of R⁴ are phenyl groups. See also Examples 7-22.

In some examples, resin-linear and/or high-phenyl-T compositions can be considered "hydrosilylation cure compositions."

As used herein, the term "silicone sealant composition" includes polysiloxane sealants, such as those disclosed in U.S. Pat. Nos. 4,962,152; 5,264,603; 5,373,079; and 5,425,947, the entireties of all of which are incorporated by reference as if fully set forth herein. It also includes XIAMETER® (Dow Corning, Midland, Mich.) brand acetoxy, alkoxy, and oxime sealants. Other silicone sealant compositions include siloxane high consistency rubber compositions such as Sotefa 70M, available from Dow Corning, Midland, Mich.

As used herein, the term "polyurea-polysiloxane composition" includes, but is not limited to, multiblock copolymers including polyurea and polysiloxane segments. In some examples, polyurea-polysiloxane compositions include polyurea-PDMS compositions including GENIOMER® (Wacker Chemie AG, Munich Germany), TECTOSIL® (Wacker Chemie AG, Munich Germany), and the like. The polyurea-polysiloxane compositions can also contain additional polymeric segments, such as polypropylene oxide soft segments. Polyurea-polysiloxane compositions also includes the polyurea-polysiloxane compositions disclosed in Published U.S. Patent Appl. No. 2010/0047589, the entirety of which is incorporated by reference as if fully set forth herein.

As used herein, the term "MQ/polysiloxane composition" includes compositions including MQ-type hot melt compositions containing an MQ silicone resin (MQ-1600 Solid Resin, MQ-1601 Solid Resin, 7466 Resin, and 7366 Resin, all of which are commercially available from Dow Corning Corporation, as well as MQ resins disclosed in U.S. Pat. No. 5,082,706, which is incorporated by reference as if fully set forth herein) and a polyorganosiloxane, such as polydimethylsiloxane (PDMS). Such compositions include, but are not limited to, Dow Corning® Q2-7735 Adhesive, and InstantGlaze Assembly Sealant MQ-type compositions also include compositions, such as those disclosed in Published PCT Appl. No. WO2010/138221 and Published U.S. Patent Appl. No. 2012/0065343 (both incorporated herein by reference in their entirety) comprising a low viscosity polydiorganosiloxane having an average of at least two aliphatically unsaturated organic groups per molecule and having a viscosity of up to 12,000 mPa·s, and a high viscosity polydiorganosiloxane having an average of at least two aliphatically unsaturated organic groups per molecule and having a viscosity of at least 45,000 mPa·s; a silicone resin having an average of at least two aliphatically unsaturated organic groups per molecule; and a crosslinker having an average, per molecule, of at least two silicon bonded hydrogen atoms.

Other MQ-type compositions include those disclosed in U.S. Pat. No. 5,708,098, the entirety of which is incorporated by reference as if fully set forth herein. Briefly, the compositions disclosed in the '098 patent include containing macromolecular polymers comprised primarily of $R_3SiO_{1/2}$ and $SiO_{4/2}$ units (the M and Q units, respectively) wherein R is a functional or nonfunctional, substituted or unsubstituted organic radical. These macromolecular polymers are referred to as "MO-resins" or "MO silicone resins." The MQ-type compositions disclosed in the '098 patent, may, in some examples, include a number of $R_2SiO_{2/2}$ and $RSiO_{3/2}$ units, respectively referred to as D and T units. MQ silicone resins are generally produced in such a manner that the resin macromolecules are dissolved in a solvent, which is typically, but not always, an aromatic solvent. Some of the embodiments of the '098 patent are directed to solventless, thermoplastic silicone pellets prepared by blending silicone resins of the MQ-type predominantly with linear silicone fluids, such as polydimethylsiloxane liquids and gums, to substantially homogeneity. The blends are heated to a predetermined compression-forming temperature, compression-formed to a densified mass and shaped into a pellet form. The composition of the pellets is balanced such that the pellets exhibit plastic flow at the predetermined compression-forming temperature and resist agglomeration at temperatures at or below a predetermined maximum storage temperature.

Other MQ-type compositions are disclosed in Published U.S. Patent Appl. No. 2011/0104506, which is incorporated by reference as if fully set forth herein. Briefly, the MQ-type compositions disclosed in the '506 application hot melt adhesive composition containing (1) a silicone resin having a silanol content of less than 2 wt % and comprised of M and Q units; (2) an organopolysiloxane comprised of difunctional units, D, and certain terminal units; (3) a silane crosslinker; and (4) a catalyst. Other MQ-type compositions are disclosed in WO2007/120197, the entirety of which is incorporated by reference as if fully set forth herein.

As used herein, the term "MQ/X-diorganosiloxane composition" includes, but is not limited to, compositions including MQ-type hot melt compositions containing an MQ silicone resin, and an X-diorganosiloxane, where X includes, but is not limited to, any organic polymer. In some examples, the organic polymer portion of the X-diorganosiloxane contains blocks, diblocks, triblocks, multi-blocks, and segmented portions containing one or more organic polymers (e.g., an acrylic polymer, a polycarbonate, an alkylene polymer or an alkylene-acrylic copolymer). In some examples, the diorganosiloxane portion of the X-diorganosiloxane contains blocks, diblocks, triblocks, multi-blocks, and segmented portions containing one or more diorganosiloxanes (e.g., PDMS, PhMe or Ph₂/Me₂). A non-limiting example of an MQ/X-diorganosiloxane includes an MQ-resin/PS-PDMS composition.

As used herein, the term "MQ-resin/PS-PDMS composition" includes polystyrene-polydimethylsiloxane compositions (e.g., trimethylsiloxy-terminated poly(styrene-block-dimethylsiloxane) copolymer having a weight average molecular weight ($M_w$) of 45,500 and a polydispersity of 1.15 and having a 31,000 g/mole styrene block and a 15,000 g/mole dimethylsiloxane block; available from Polymer Source, Inc.) containing an MQ-resin. Examples of such MQ-resin/PS-PDMS compositions are disclosed in WO 2012/071330, the entirety of which is incorporated by reference as if fully set forth herein.

Still other MQ-type compositions include those disclosed in Published U.S. Patent Appl. No. 2012/0125436, which is incorporated by reference as if fully set forth herein. Such compositions comprise thermoplastic elastomers comprising at least one silicone ionomer (i.e., polymers in which the bulk properties are governed by ionic interactions in discrete regions of the material).

As used herein, the term "polyimide-polysiloxane composition" includes compositions including polyimide polysiloxanes such as those disclosed in U.S. Pat. Nos. 4,795,680; 5,028,681; 5,317,049; and the like, the entireties of which are incorporated by reference as if fully set forth herein. Polyimide-polysiloxane compositions also include compositions containing PDMS-containing polyimide copolymers including, but not limited to, imide-siloxane compositions containing imide-siloxanes of the formula:

As used herein, the term "polyacrylate-polysiloxane composition" include, but are not limited to polyacrylate-modified polysiloxanes such as those disclosed in U.S. Pat. Nos. 8,076,440; and 7,230,051; as well as mixtures of polyacrylate resins and siloxane-containing copolymers, such as those disclosed in U.S. Pat. No. 4,550,4139, the entireties of which are incorporated by reference as if fully set forth herein.

As used herein the term "polyisobutylene-polysiloxane composition," includes, but is not limited to, compositions including polyisobutylene-polysiloxane compositions such as those disclosed in EP0969032, and the like, the entirety of which is incorporated by reference as if fully set forth herein.

Other compositions contemplated for use as encapsulants include ethylene-vinyl acetate (EVA) copolymers and polyvinyl fluoride films (e.g., TEDLAR®, Dupont, Wilmington, Del.).

Also contemplated herein are encapsulants containing perfluorinated polymer compositions having alkenyl groups and a perfluoroether backbone, where the alkenyl groups can react with a fluorinated organohydrogensiloxane via a hydrosilylation cure mechanism in the presence of a platinum catalyst. Such compositions are disclosed in Published U.S. Appl. No. US2009/0284149 and JP2010-123769, the

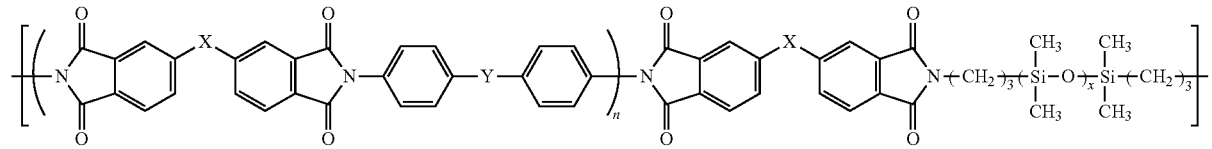

such as those disclosed in Rogers, M. E.; et al., *J. of Polymer Sci. A: Poly Chem* 32: 2663 (1994); and Contemporary Topics in Polymer Science 47-55 (Salamone, J. S and. Riffle, J. S. eds., New York: Plenum Press 1992), the entireties of which are incorporated by reference as if fully set forth herein.

As used herein, the term "polycarbonate-polysiloxane composition" includes, but is not limited to, compositions including polycarbonate-polysiloxane compositions such as those disclosed in U.S. Pat. Nos. 7,232,865; 6,870,013; 6,630,525; 5,932,677; 5,932,677; and the like, the entireties of which are incorporated by reference as if fully set forth herein. Polycarbonate-polysiloxane compositions also include compositions containing polycarbonate-polysiloxanes such as those disclosed in Contemporary Topics in Polymer Science 265-288 (Culbertson, ed., Plenum 1989); Chen, X., et al., *Macromolecules* 26: 4601 (1993); Dwight, D. W. et al., *Journal of Electron Spectroscopy* and Related Phenomena 52: 457 (1990); and Furukawa, N, et al., *J. Adhes.* 59: 281 (1996), the entireties of which are incorporated by reference as if fully set forth herein.

As used herein, the term "polyurethane-polysiloxane composition," includes, but is not limited to, compositions including polyurethane-polysiloxane compositions such as those disclosed in U.S. Pat. No. 6,750,309; U.S. Pat. No. 4,836,646; U.S. Pat. No. 4,202,807; and the like, the entireties of which are incorporated by reference as if fully set forth herein. Polyurethane-polysiloxane compositions also include compositions containing polyurethane-polysiloxanes such as those disclosed in Chen, X., et al., *Macromolecules* 26: 4601 (1993); Dwight, D. W. et al., *Journal of Electron* Spectroscopy and Related Phenomena 52: 457 (1990), the entireties of which are incorporated by reference as if fully set forth herein.

entireties of which are incorporated by reference as if fully set forth herein. The compositions disclosed in the '149 and '769 applications also contain silica having a specific surface area.

Resin-linear compositions are known in the art and are described, for example, in Published U.S. Appl. Nos. 2013/0168727; 2013/0171354; 2013/0245187; 2013/0165602; and 2013/0172496, all of which are expressly incorporated by reference as if fully set forth herein. In some specific examples, resin-linear compositions contain organosiloxane block copolymers containing: 40 to 90 mole percent disiloxy units of the formula $[R^1{}_2SiO_{2/2}]$, 10 to 60 mole percent trisiloxy units of the formula $[R^2SiO_{3/2}]$, 0.5 to 25 mole percent silanol groups [≡SiOH]; wherein: $R^1$ is independently a $C_1$ to $C_{30}$ hydrocarbyl, $R^2$ is independently a $C_1$ to $C_{20}$ hydrocarbyl; wherein: the disiloxy units $[R^1{}_2SiO_{2/2}]$ are arranged in linear blocks having an average of from 10 to 400 disiloxy units $[R^1{}_2SiO_{2/2}]$ per linear block, the trisiloxy units $[R^2SiO_{3/2}]$ are arranged in non-linear blocks having a molecular weight of at least 500 g/mole, at least 30% of the non-linear blocks are crosslinked with each other and are predominately aggregated together in nano-domains, each linear block is linked to at least one non-linear block; and the organosiloxane block copolymer has a weight average molecular weight of at least 20,000 g/mole, and is a solid at 25° C.

When solid compositions are formed from curable compositions of the resin-linear organosiloxane block copolymers described herein, which, in some embodiments also contain an organosiloxane resin (e.g., free resin that is not part of the block copolymer), the organosiloxane resin also predominately aggregates within the nano-domains.

The solid composition of this disclosure may include phase separated "soft" and "hard" segments resulting from blocks of linear D units and aggregates of blocks of non-linear T units, respectively. These respective soft and hard segments may be determined or inferred by differing glass transition temperatures ($T_g$). Thus a linear segment may be described as a "soft" segment typically having a low $T_g$, for example less than 25° C., alternatively less than 0° C., or alternatively even less than −20° C. The linear segments typically maintain "fluid" like behavior in a variety of conditions. Conversely, non-linear blocks may be described as "hard segments" having higher $T_g$, values, for example greater than 30° C., alternatively greater than 40° C., or alternatively even greater than 50° C.

An advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer the significant advantage of being "re-processable" in conjunction with the benefits typically associated with silicones, such as; hydrophobicity, high temperature stability, moisture/UV resistance.

In some embodiments, the solid compositions, which include a resin-linear organosiloxane block copolymer, also contain a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein. A stabilizer is added to the resin-linear organosiloxane block copolymers, as described above, to improve shelf stability and/or other physical properties of solid compositions containing the organosiloxane block copolymers. The stabilizer may be selected from an alkaline earth metal salt, a metal chelate, a boron compound, a silicon-containing small molecule or combinations thereof.

Although not wishing to be bound by any theory, the stabilizer component may behave as a condensation catalyst. For example, treatment with a salt such as calcium chloride or catalysts like metal chelates (e.g., magnesium acetylacetonate or Al(acac)$_3$) during the synthesis (e.g., at the end of synthesis) of the resin-linear organosiloxane block copolymers described herein, greatly increases the stability of the product. This is surprising and unexpected, since catalysts would be expected to reduce shelf stability of the silanol functional copolymers. However, while not being bound by theory, it is believed that, in some cases, the stabilizers may be preferentially soluble in the phase separated resin-rich phase and enhance condensation of the silanol groups present in this phase. Since this phase (i.e., the resin-rich phase) mainly contains residual "free resin", condensation of this phase can subsequently increase the cure temperature of the matrix containing the resin-linear block copolymers. For example, in the absence of the stabilizers described herein, a typical resin-linear material with elastomeric behavior (e.g., based on 20 mole % Phenyl-silsesquioxane resin and 184 dp polydimethylsiloxane, also known as "PDMS"), will have a flow onset around 80° C. followed by further condensation cure around 120° C. from residual silanol groups residing on the resin blocks, resulting in a material with tensile strength from 2-5 MPa and elongation at break from 200-600%. The same resin-linear material comprising a stabilizer will have its cure temperature significantly extended from 120 to 180° C.

This disclosure also provides a curable silicone composition. The curable silicone composition includes an organosiloxane block copolymer described herein. In some embodiments, the curable silicone composition also includes an organic solvent. In some embodiments, the term "curable silicone composition" also includes a combination of the solid composition in, or combined with, a solvent. The organic solvent, in some embodiments, is an aromatic solvent, such as benzene, toluene, or xylene. In some embodiments, the solvent substantially (e.g., completely or entirely) dissolves the organosiloxane block copolymer described herein.

Curable compositions described herein may further contain an organosiloxane resin (e.g., free resin that is not part of the block copolymer). The organosiloxane resin present in these compositions typically will be the organosiloxane resin used to prepare the organosiloxane block copolymer. Thus, the organosiloxane resin may comprise at least 60 mol % of [$R^2SiO_{3/2}$] siloxy units in its formula (e.g., at least 70 mol % of [$R^2SiO_{3/2}$] siloxy units, at least 80 mole % of [$R^2SiO_{3/2}$] siloxy units, at least 90 mole % of [$R^2SiO_{3/2}$] siloxy units, or 100 mole % of [$R^2SiO_{3/2}$] siloxy units; or 60-100 mole % [$R^2SiO_{3/2}$] siloxy units, 60-90 mole % [$R^2SiO_{3/2}$] siloxy units or 70-80 mole % [$R^2SiO_{3/2}$] siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

When the curable composition includes organosiloxane block copolymer, organic solvent, and optional organosiloxane resin, the amounts of each component may vary. The amount of the organosiloxane block copolymers, organic solvent, and optional organosiloxane resin in the present curable composition may vary. The curable composition of the present disclosure may contain: 40 to 80 weight % of an organosiloxane block copolymer as described herein (e.g., 40 to 70 weight %, 40 to 60 weight %, 40 to 50 weight %); 10 to 80 weight % of an organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight; and 5 to 40 weight %); and organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %); such that the sum of the weight % of these components does not exceed 100%.

In one example, the curable compositions consist essentially of the organosiloxane block copolymer as described herein, the organic solvent, and the organosiloxane resin. In this example, the weight % of these components sum to 100%, or nearly 100%. The terminology "consisting essentially of" relative to the immediately aforementioned example, describes that, in this example, the curable silicone composition is free of silicone or organic polymers that are not the organosiloxane block copolymer or organosiloxane resin of this disclosure.

Curable silicone compositions can also include a cure catalyst. The cure catalyst may be chosen from any catalyst known in the art to effect (condensation) cure of organosiloxanes, such as various tin or titanium catalysts. Condensation catalysts can be any condensation catalyst typically used to promote condensation of silicon bonded hydroxy (=silanol) groups to form Si—O—Si linkages. Examples include, but are not limited to, amines, complexes of lead, tin, titanium, zinc, and iron.

In various embodiments, solid compositions can be formed by a method that includes the step of reacting one or more resins, such as Phenyl-T resins, with one or more (silanol) terminated siloxanes, such as PhMe siloxanes. Alternatively, one or more resins can be reacted with one or more capped siloxane resins, such as silanol terminated siloxanes capped with MTA/ETA, MTO, ETS 900, and the like. In another example, solid compositions are formed by reacting one or more components described above and/or one or more components. In still another example, the method may include one or more steps described any of the aforementioned applications.

Alternatively, a method may include the step of providing the composition in a solvent, e.g., a curable silicone composition that includes a solvent, and then removing the solvent to form the solid composition. The solvent may be removed by any known processing techniques. In one example, a film including the organosiloxane block copolymer is formed and the solvent is allowed to evaporate from a curable silicone composition thereby forming a film. Subjecting the films to elevated temperatures, and/or reduced pressures, will accelerate solvent removal and subsequent formation of the solid composition. Alternatively, a curable silicone composition may be passed through an extruder to remove solvent and provide a solid composition in the form of a ribbon or pellets. Coating operations against a release film can also be used as in slot die coating, knife over roll coating, rod coating, or gravure coating. Also, roll-to-roll coating operations can be used to prepare a solid film. In coating operations, a conveyer oven or other means of heating and evacuating the solution can be used to drive off the solvent and obtain a solid composition.

Organosiloxane block copolymer may be formed using a method that includes the step of I) reacting a) a linear organosiloxane and b) an organosiloxane resin comprising at least 60 mol % of $[R^2SiO_{3/2}]$ siloxy units in its formula, in c) a solvent. In one example, the linear organosiloxane has the formula $R^1{}_q(E)_{(3-q)}SiO(R^1{}_2SiO_{2/2})_nSi(E)_{(3-q)}R^1{}_q$, wherein each $R^1$ is independently a $C_1$ to $C_{30}$ hydrocarbyl, n is 10 to 400, q is 0, 1, or 2, E is a hydrolyzable group including at least one carbon atom. In another example, each $R^2$ is independently a $C_1$ to $C_{20}$ hydrocarbyl. In still another example, the amounts of a) and b) used in step I are selected to provide the organosiloxane block copolymer with 40 to 90 mol % of disiloxy units $[R^1{}_2SiO_{2/2}]$ and 10 to 60 mol % of trisiloxy units $[R^2SiO_{3/2}]$. In an even further example, at least 95 weight percent of the linear organosiloxane added in step I is incorporated into the organosiloxane block copolymer.

In still another example, the method includes step of II) reacting the organosiloxane block copolymer from step I), e.g., to crosslink the trisiloxy units of the organosiloxane block copolymer and/or to increase the weight average molecular weight ($M_w$) of the organosiloxane block copolymer by at least 50%. A further example includes the step of further processing the organosiloxane block copolymer to enhance storage stability and/or optical clarity and/or the optional step of removing the organic solvent.

A curable silicone composition may be formed using a method that includes the step of combining the solid composition and a solvent, as described above. The method may also include one or more steps of introducing and/or combining additional components, such as the organosiloxane resin and/or cure catalyst to one or both of the solid composition and the solvent. A solid composition and the solvent may be combined with each other and/or any other components using any method known in the art such as stirring, vortexing, mixing, etc.

In some examples, the optical assembly of the embodiments described herein comprises a first layer and a second layer wherein the layers are cured. The mechanism by which the first layer is cured may be the same or different than the mechanism by which the second layer is cured. Curing mechanisms include, but are not limited to a hot melt or heat cure, moisture cure, a hydrosilylation cure (as described below), a condensation cure, peroxide/radical cure, photo cure or a click chemistry-based cure that involves, in some examples, metal-catalyzed (copper or ruthenium) reactions between an azide and an alkyne or a radical-mediated thiol-ene reactions. Other cure mechanisms include, but are not limited to peroxide vinyl-$CH_3$ cure; acrylic radical cure; alkyl borane cure; and epoxy-amine/phenolic cure.

This disclosure also provides a method of forming the optical assembly. The method includes the step of combining the light emitting diode and the layer to form the optical assembly. The step of combining is not particularly limited and may be include, or be further defined as, disposing the light emitting diode and the layer next to each other or on top of each other, and/or in direct or in indirect contact with each other. For example, the layer may be disposed on and in direct contact with the light emitting diode. Alternatively, the layer may be disposed on, but separated from and not in direct contact with, the light emitting diode yet may still be disposed on the light emitting diode.

The layer may be heated to flow, melted, pressed, (vacuum) laminated, compression molded, injection transfer molded, calendared, hot-embossed, injection molded, extruded, or any other process step that changes the layer from a solid to a liquid or to a softened solid.

The liquid or softened layer may then be applied to the light emitting diode by any one or more of the aforementioned techniques, via spraying, pouring, painting, coating, dipping, brushing, or the like.

In one example, the step of combining is further defined as melting the layer such that the solid composition is disposed on and in direct contact with the light emitting diode. In another example, the step of combining is further defined as melting the layer such that the layer is disposed on and in indirect contact with the light emitting diode. In still another example, the method further includes the step of providing a solution of the solid composition in a solvent, e.g., dissolved or partially dissolved in the solvent. In an even further example, the method includes the step of removing the solvent to form the solid composition to form the layer prior to the step of combining the light emitting diode and the layer. In still another example, the method further includes the step of forming the solid composition into the layer subsequent to the step of removing the solvent and prior to the step of combining the light emitting diode and the layer.

In other embodiments, the method includes the step of curing the solid composition, e.g., via a condensation reaction, a free radical reaction, or a hydrosilylation reaction. Any catalysts, additives, and the like may be utilized in the step of curing. For example, acidic or basic condensation catalysts may be utilized. Alternatively, hydrosilylation catalysts, such as platinum catalysts, may be utilized. In one example, the step of curing occurs at a temperature higher than the melting temperature of the solid composition. Alternatively, the step of curing may occur at approximately the melting temperature, or below the melting temperature, of the layer.

EXAMPLES

A series of examples including solid compositions and organosiloxane block copolymers are formed according to this disclosure. A series of comparative examples are also formed but not according to this disclosure. After formation, the examples and the comparative examples are formed into sheets which are then further evaluated.

Example 1

A 500 mL 4 neck round bottom flask is loaded with toluene (65.0 g) and Phenyl-T Resin (FW=136.6 g/mol Si; 35.0 g, 0.256 mols Si). The flask is equipped with a thermometer, Teflon stir paddle, and a Dean Stark apparatus prefilled with toluene and attached to a water-cooled condenser. A nitrogen blanket is then applied. An oil bath is used to heat the flask at reflux for 30 minutes. Subsequently, the flask is cooled to about 108° C. (pot temperature).

A solution of toluene (35.0 g) and silanol terminated PhMe siloxane (140 dp, FW=136.3 g/mol Si, 1.24 mol % SiOH, 65.0 g, 0.477 mols Si) is then prepared and the siloxane is capped with 50/50 MTA/ETA (Avg. FW=231.2 g/mol Si, 1.44 g, 0.00623 mols) in a glove box (same day) under nitrogen by adding 50/50 MTA/ETA to the siloxane and mixing at room temperature for 2 hours. The capped siloxane is then added to the Phenyl-T Resin/toluene solution at 108° C. and refluxed for about 2 hours.

After reflux, the solution is cooled back to about 108° C. and an additional amount of 50/50 MTA/ETA (Avg. FW=231.2 g/mol Si, 6.21 g, 0.0269 mols) is added and the solution is then refluxed for an additional hour.

Subsequently, the solution is cooled to 90° C. and then 12 mL of DI water is added. The solution including the water is then heated to reflux for about 1.5 hours to remove the water via azeotropic distillation. The addition of water and subsequent reflux is then repeated. A total amount of aqueous phase removed is about 27.3 g.

Subsequently, some toluene (about 54.0 g) along with most residual acetic acid is then distilled off (for about 20 minutes) to increase the solids content.

The solution is then cooled to room temperature and the solution is pressure filtered through a 5.0 μm filter to isolate the solid composition.

The solid composition is analyzed by $^{29}$Si NMR which confirms a structure of $D^{PhMe}_{0.635}T^{Alkyl}_{0.044}T^{Cyclohexyl}_{0.004}T^{Ph}_{0.317}$ with an OZ of about 11.8 mol %.

Example 2

A 2 L 3 neck round bottom flask is loaded with toluene (544.0 g) and 216.0 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (176.0 g) and 264.0 g of the silanol terminated PhMe siloxane described above is prepared and the siloxane is capped with 50/50 MTA/ETA (4.84 g, 0.0209 mols Si) in a glove box (same day) under nitrogen by adding the MTA/ETA to the siloxane and mixing at room temperature for 2 hrs, as also described above.

The capped siloxane is then added to the Phenyl-T Resin/toluene solution at 108° C. and refluxed for about 2 hours.

After reflux, the solution is cooled back to about 108° C. and an additional amount of 50/50 MTA/ETA (38.32 g, 0.166 mols Si) is added and the solution is then refluxed for an additional 2 hours.

Subsequently, the solution is cooled to 90° C. and then 33.63 g of DI water is added.

The solution including the water is then heated to reflux for about 2 hours to remove the water via azeotropic distillation. The solution is then heated at reflux for 3 hrs. Subsequently, the solution is cooled to 100° C. and then pre-dried Darco G60 carbon black (4.80 g) is added thereto.

The solution is then cooled to room temperature with stirring and then stirred overnight at room temperature. The solution is then pressure filtered through a 0.45 μm filter to isolate the solid composition.

The solid composition is analyzed by $^{29}$Si NMR which confirms a structure of $D^{PhMe}_{0.519}T^{Alkyl}_{0.050}T^{Ph}_{0.431}$ with an OZ of about 22.2 mol %. No acetic acid is detected in the solid composition using FT-IR analysis.

Example 3

A 500 mL 3-neck round bottom flask is loaded with toluene (86.4 g) and 33.0 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (25.0 g) and 27.0 g of the silanol terminated PhMe siloxane described above is prepared and the siloxane is capped with Methyl tris(methylethylketoxime)silane ((MTO); MW=301.46) in a glove box (same day) under nitrogen by adding the MTA/ETA to the siloxane and mixing at room temperature for 2 hrs, as also described above.

The capped siloxane is then added to the Phenyl-T Resin/toluene solution at 108° C. and refluxed for about 3 hours. As described in greater detail below, films are then cast from this solution. The organosiloxane block copolymer in the solution is analyzed by $^{29}$Si NMR which confirms a structure of $D^{PhMe}_{0.440}T^{Me}_{0.008}T^{Ph}_{0.552}$ with an OZ of about 17.0 mol %. No acetic acid is detected in the solid composition using FT-IR analysis.

Example 4

A 5 L 4 neck round bottom flask is loaded with toluene (1000.0 g) and 280.2 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (500.0 g) and 720.0 g of a silanol terminated PDMS (FW=74.3 g/mol Si; ~1.01 mol % OH) is prepared and the PDMS is capped with 50/50 MTA/ETA (23.77 g, 0.1028 mols Si) in a glove box (same day) under nitrogen by adding the MTA/ETA to the siloxane and mixing at room temperature for 30 minutes, as also described above.

The capped PDMS is then added to the Phenyl-T Resin/toluene solution at 108° C. and refluxed for about 3 hours fifteen minutes.

After reflux, the solution is cooled back to about 108° C. and an additional amount of 50/50 MTA/ETA (22.63 g, 0.0979 mols Si) is added and the solution is then refluxed for an additional 1 hour.

Subsequently, the solution is cooled to 100° C. and then 36.1 g of DI water is added.

The solution including the water is then heated at 88-90° C. for about 30 minutes and then heated at reflux for about 1.75 hours to remove about 39.6 grams of water via azeotropic distillation. The solution is then left overnight to cool.

Subsequently, the solution heated to reflux for 2 hours and then allowed to cool to 100° C. To reduce the acetic acid level, 126.8 g of DI water is then added and azeotropically removed over a 3.25 hr time period. The amount removed from the Dean Stark apparatus is about 137.3 g. The solution is then cooled to 100° C. Subsequently, 162.8 g of water is then added and then azeotropically removed over a 4.75 hr time period. The amount removed from the Dean Stark apparatus is about 170.7 g. The solution is then cooled to 90° C. and 10 g of Darco G60 carbon black is added thereto. The solution is then cooled to room temperature with stirring and then allowed to stir overnight at room temperature.

The solution is then pressure filtered through a 0.45 μm filter to isolate the solid composition.

The solid composition is analyzed by $^{29}$Si NMR which confirms a structure of $D^{Me2}_{0.815}T^{Alkyl}_{0.017}T^{Ph}_{0.168}$ with an OZ of about 6.56 mol %. No acetic acid is detected in the solid composition using FT-IR analysis.

Example 5

A 12 L 3 neck round bottom flask is loaded with toluene (3803.9 g) and 942.5 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (1344 g) and 1829.0 g of the silanol terminated PDMS described immediately above is prepared and the PDMS is capped with MTO (Methyl tris(methylethylketoxime)silane (85.0 g, 0.2820 mols Si)) in a glove box (same day) under nitrogen by adding the MTO to the siloxane and mixing at room temperature for 2 hours, as also described above.

The capped PDMS is then added to the Phenyl-T Resin/toluene solution at 110° C. and refluxed for about 2 hours ten minutes. Subsequently, 276.0 g of n-butanol is added and the solution is then refluxed for 3 hours and then allowed to cool to room temperature overnight.

Subsequently, about 2913 g of toluene is removed by distillation to increase a solids content to ~50 weight %. A vacuum is then applied at 65-75° C. for ~2.5 hrs. Then, the solution is filtered through a 5.0 μm filter after setting for 3 days to isolate the solid composition.

The solid composition is analyzed by $^{29}$Si NMR which confirms a structure of $D^{Me2}_{0.774}T^{Me}_{0.009}T^{Ph}_{0.217}$ with an OZ of about 6.23 mol %. No acetic acid is detected in the solid composition using FT-IR analysis.

Example 6

A 1 L 3 neck round bottom flask is loaded with toluene (180.0 g) and 64.9 g of the Phenyl-T resin described. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (85.88 g) and 115.4 g of the silanol terminated PDMS is prepared and the PDMS is capped with ETS 900 (50 wt % in toluene; Average FW=232/4 g/mol Si). in a glove box (same day) under nitrogen by adding ETS 900/toluene (8.25 g, 0.0177 mols Si) to the silanol terminated PDMS and mixing at room temperature for 2 hours.

The capped PDMS is then added to the Phenyl-T Resin/toluene solution at 108° C. and refluxed for about 2 hours.

Subsequently, the solution is cooled back to 108° C. and an additional amount of the ETS900 (15.94 g, 0.0343 mols Si) is added. The solution is then heated at reflux for one hour and then cooled back to 108° C. An additional amount of the ETS 900/toluene (2.23 g, 0.0048 mols Si) is then added and the solution is again heated at reflux for one hour.

Subsequently, the solution is cooled to 100° C. and 30 mL of DI water is added. The solution is again heated to reflux to remove water via azeotropic distillation. This process is repeated 3×.

Then, the solution is heated and ~30 g of solvent is distilled off to increase the solids content. The solution is then cooled to room temperature and filtered through a 5.0 μm filter to isolate the solid composition.

The solid composition is analyzed by $^{29}$Si NMR which confirms a structure of $D^{Me2}_{0.751}T^{Alkyl}_{0.028}T^{Ph}_{0.221}$ with an OZ of about 7.71 mol %. No acetic acid is detected in the solid composition using FT-IR analysis.

Example 7

In an example, a composition having 8630 mPa·s in viscosity may be prepared by mixing 75 parts of methylphenylvinylpolysiloxane represented by an average composition equation: $(MeViSiO_{2/2})_{0.25}(Ph_2SiO_{2/2})_{0.3}(PhSiO_{3/2})_{0.45}$, 25 parts of a trisiloxane represented by molecular equation: $(HMe_2SiO)_2SiPh_2$, 10 parts of mehtylphenylvinylpolysiloxane represented by a molecular equation: $ViMe_2SiO(SiMePhO)_{17.5}SiMe_2Vi$, 0.001 parts of a solution of platinum 1,3-divinyl-1,1,3,3-tetramethyldisiloxane complex in 1,3-divinyl-1,1,3,3-tetramethyldisiloxane which contains 4.5% Pt metal giving 5 ppm of platinum in the composition, and 0.006 parts of ehthynylcyclohexanol. The composition may be heated at 100° C. for 30 minutes in a mold, such as made of metal. The material may be flowable at 100° C. but cooling to 25° C. may create a tackfree solid. The Shore A hardness at 25° C. may be approximately 68. A B-stage sheet with one (1) millimeter thickness may be prepared in the same manner. A moving die rheometer (MDR) measurement at 130° C. showed 0.01 dNm as an example of a minimum torque value.

Example 8

In an example, a composition having 17090 mPa·s in viscosity may be prepared by mixing 37.5 parts of methylphenylvinylpolysiloxane represented by an average composition equation: $(MeViSiO_{2/2})_{0.25}(Ph_2SiO_{2/2})_{0.3}(PhSiO_{3/2})_{0.45}$, 40 parts of mehtylvinylphenylpolysiloxane represented by an average composition equation: $(Me_2ViSiO_{1/2})_{0.2}PhSiO_{3/2})_{0.8}$, 22.5 parts of a trisiloxane represented by molecular equation: $(HMe_2SiO)_2SiPh_2$, 10 parts of mehtylphenylvinylpolysiloxane represented by a molecular equation: $ViMe_2SiO(SiMePhO)_{17.5}SiMe_2Vi$, 0.001 parts of a solution of platinum 1,3-divinyl-1,1,3,3-tetramethyldisiloxane complex in 1,3-divinyl-1,1,3,3-tetramethyldisiloxane which contains 4.5% Pt metal giving 5 ppm of platinum in the composition, and 0.006 parts of ehthynylcyclohexanol. The composition may be heated at 100° C. for 15 minutes in a mold, such as is made of metal. The material may be flowable at 100° C. but cooling to 25

C gave tackfree solid. The Shore A hardness at 25° C. may be 55. The B-stage sheet with one (1) millimeter thickness was prepared in the same manner. A MDR (Moving Die Rheometer) measurement at 130° C. showed 0.02 dNm as the minimum torque value.

Comparative Example 1

A 1 L 3 neck round bottom Intended Morton Type flask with a bottom drain is loaded with DI water (196.1 g). The flask is equipped with a thermometer, Teflon stir paddle, and a water-cooled condenser. An addition funnel is loaded with $PhSiCl_3$ (82.95 g) and $PhMeSiCl_2$ (58.87 g) and toluene (142.65 g). This solution is added to the flask slowly starting at room temperature. Upon addition to the flask, the solution exotherms to 78° C. The solution is mixed for 15 min. Subsequently, the aqueous phase is removed and HCl is removed by water washing.

Then 25 mL DI water is added to the solution and the solution is heated at 80° C. for 15 min. The aqueous phase is then removed and the solution is then heated to reflux and additional water is removed via azeotropic distillation. These steps are repeated several times.

Subsequently, the solution is heated to distill solvent and to increase the solids content. The product is then stripped to dryness using a rotavapor at an oil bath temperature of 120° C. and ~0.5 mm Hg and filtered to isolate the product.

The product is analyzed by $^{29}Si$ NMR which confirms a structure of $D^{PhMe}_{0.437} T^{Cyclohexyl}_{0.007} T^{Ph}_{0.556}$ with an OH content of about 44.5 mol % (5.55 wt %) and having a FW of about 136 g/mol.

Comparative Example 2

The components set forth below are mixed using a vacuum planetary mixer, Thinky ARV-310, for 2 minutes at 1600 rpm under 2 kPa to form a liquid composition.

Component 1: Average Unit Molecular Formula: $(Me_2ViSiO_{1/2})_{0.25}(PhSiO_{3/2})_{0.75}$; 5.8 g;
Component 2: Average Unit Molecular Formula: $Me_2ViSiO(MePhSiO)_{25}OSiMe_2Vi$; 1.8 g;
Component 3: Average Unit Molecular Formula: $HMe_2SiO(Ph_2SiO)SiMe_2H$; 2.0 g;
Component 4: Average Unit Molecular Formula: $(HMe_2SiO_{1/2})_{0.60}(PhSiO_{3/2})_{0.4}$; 0.24 g;
Component 5: Average Unit Molecular Formula: $(Me_2ViSiO_{1/2})_{0.18} (PhSiO_{3/2})_{0.54}(EpMeSiO)_{0.28}$ wherein (Ep=glicidoxypropyl); 0.23 g;
Component 6: Average Unit Molecular Formula: Cyclic $(ViSiMeO_{1/2})_n$; 0.02 g;
1-Ethynyl-1-Cyclohexanol; 240 ppm
Pt Catalyst (1,3-divinyltetramethylsiloxane complex); 2 ppm Comparative Example 3

Comparative Example 3 is prepared from the following using a vacuum planetary mixer:
Vinyldimethylsiloxy terminated polydimethylsiloxane (Average $M_w$=60,000); 42.9 parts
Vinyldimethylsiloxy terminated polydimethylsiloxane (Average $M_w$=24,000); 14.5 parts
Vinyldimethylsiloxy and trimethylsiloxy functional silica; 1.0 part
Trimethylsiloxy functional silica; 5.7 parts
1,5-divinyl-1,1,5,5-tetramethyldisiloxane coordinated Platinum catalyst (Pt content 5 ppm for the total composition)
$(Allylglycidoxypropyl-SiO_{3/2})_{0.5}(MeSiViO_{2/2})_{0.3}(Me_2SiO_{2/2})$ 0.2; 11.7 parts After formation, Comparative Example 3 is casted on a polyethersulfone coated film and then heated at 100° C. for 3 minutes to form a film.

Evaluation of Example and Comparative Examples:

After each of the aforementioned Examples are formed, various samples are evaluated to determine Modulus at 25° C., Shore A Hardness (cured), Melt Viscosity at 120° C., Trouser Tear, Tensile Strength, Elongation at Break, and Flexibility. The results of these evaluations are set forth in Table 1 below.

TABLE 1

| Example | Modulus at 25° C. MPa | Shore A Hardness Cured | Melt Viscosity at 120° C., Pa · s | Trouser Tear kN/m | Tensile Strength MPa | Elongation at Break % | Flexibility |
|---|---|---|---|---|---|---|---|
| Example 1 | 121 | Not available | 71 | 1.8 | 6.66 | 121 | Excellent |
| Example 2 | 250 | 88 | 145 | 1.5 | 4.3 | 195 | Excellent |
| Example 3 | Not available | Not available | 422 | Not available | 8.5 | 26 | Good |
| Example 4 | 1.1 | 36 | 44,000 | 1.0 | 3.5 | 347 | Excellent |
| Example 5 | Not available | 56 | 32,000 | 3.4 | 1.5 | 195 | Excellent |
| Example 6 | 2.8 | 54 | 160,000 | <0.1 | 6.6 | 366 | Excellent |
| Comp. Ex. 1 | Too Brittle To Evaluate | Not available | Not available | Not available | Too Brittle To Evaluate | Too Brittle To Evaluate | Poor |
| Comp. Ex. 2 | 16.3 | 80 | Not available | Not available | 3 | 50 | Poor |
| Comp. Ex. 3 | 0.2 | 36 | Not available | Not available | 4.2 | 500 | Excellent |

Tear (ASTM D624) Specimens are die cut from sheets typically measuring 1-2 mm in thickness. Testing type T (trouser) three specimens are prepared depending on the amount of sample sheet available. Before testing no special storage considerations are taken as the sheets are not expected to be significantly affected by small changes in temperature or humidity. Specimens are tested at ambient temperature and humidity with an Instron universal test machine utilizing Bluehill 2 software. For type B and C specimens the test speed used is 500 mm/min and specimens are pulled to failure. Median peak force/thickness is reported. For type T (trouser) specimens a pulling speed of 50 mm/min is used and specimens are pulled until the tear force is seen to level off or until failure occurred. After testing the beginning and ending points of the level region of the force curve are indentified visually. Then the analyzing function of the software is used to calculate the average tear force/thickness within the identified region. If more than one specimen was tested the median reading is reported.

Durometer (ASTM D2240) specimens approximately 6 mm thick are prepared by stacking together multiple pieces of sheets. Test equipment includes an analog Shore A durometer head mounted to an operating stand that both controlled the force and application speed. Three or five measurements are taken depending on size of specimen. Readings are taking after 1 sec of contact. Median readings are reported.

Tensile (ASTM D412) Specimens are die cut from sheets typically measuring 1-2 mm in thickness. Preferred specimen size is Type C, although smaller sizes can be cut so that three specimens can be obtained. Before testing no special storage considerations are taken as the sheets are not expected to be significantly affected by small changes in temperature or humidity. Specimens are tested at ambient temperature and humidity with an Instron universal test machine utilizing Bluehill 2 software. Test speed used is 500 mm/min, and specimens are pulled to failure. Median elongation and tensile strength, at both peak and breaking point, are reported along with Young's modulus. Raw stress-strain curves are also exported for further analysis and comparison with other materials.

Formation and Evaluation of Films and a Liquid:

After each of the aforementioned Examples are formed, 14.5 mg samples of Examples 2 and 4-6, along with Comparative Examples 2 and 3 are placed in an LED package and cured to form Optical assemblies 2 and 4-6 and Comparative Optical assemblies 2 and 3, respectively.

The LED package is TTI-5074 with BridgeLux's LED chip MK04545C, commercially available from Chiun Precision Industry.

Example 2 is cured via processing during pressing under 10N-30N of gradually increasing pressure and at temperatures increasing from 50-130° C., followed by 150° C./20 min and post baking at 160° C. for 3 h.

Examples 4-6 are each cured at 150° C. for 20 minutes pressing under 10N-30N of gradually increasing pressure followed by heating at 160° C. for 3 hours in an oven.

Comparative Example 2 is cured at 150° C. for 1 hour in an oven without any pressure.

Comparative Example 3 is cured at 150° C. for 1 hour in a press under 10N-30N of gradually increasing pressure but without use of any oven.

During or after formation of each Optical assembly, each Optical assembly is evaluated to determine Refractive Index, Wire Bending During Encapsulation, Reflow Stability (delamination), and Thermal Cycling Stability (# of Cycles Until Wire Opening).

TABLE 2

|  | Example/ Light 2 | Example/ Light 4 | Example/ Light 5 | Example/ Light 6 | Comp. Example/ Light 2 | Comp. Example/ Light 3 |
| --- | --- | --- | --- | --- | --- | --- |
| RI of Example After Curing | 1.56 | 1.44 | 1.45 | 1.45 | 1.54 | 1.41 |
| Wire bending During Encapsulation | No | Yes | No | Yes | No | Yes |
| Reflow stability (Delamination) | Excellent | Acceptable | Excellent | Acceptable | Poor | Not available |
| Thermal cycling stability (# cycles until wire opening) | Excellent >1000 | Excellent >1000 | Excellent >1000 | Excellent >1000 | Poor ~200 | Not available |

Refractive Index is determined by a prism coupling method with a 632.8 nm wavelength laser at room temperature using Metricon Mode12010/M Prism Coupler.

Wire Bending During Encapsulation is determined by microscope observation and comparison between before and after encapsulation.

Reflow Stability (delamination) is determined by observation using an optical microscope with a cross polarizing filter, wherein little light scattering images indicates no delamination. The descriptor "excellent" describes no delamination condition. The descriptor "acceptable" describes little delamination condition. The descriptor "poor" describes significant delamination condition.

Thermal Cycling Stability (# of Cycles Until Wire Opening) is determined by LED light on/off testing, where failure of LEDs to light is indicative of wire opening.

More specifically, the reflow stability of Example 2 is evaluated wherein a single cycle includes exposing the sample to temperatures of −40° C. for 30 minutes ramping up to 125° C. within 2 minutes, holding at 125° C. for 30 minutes and ramping back down to −40° C. within 2 minutes. FIG. 1 shows the result of before and after reflow. The top line shows normal microscope image, and the others show cross-polarized microscope images. Comparison with Comparative Example 2 (see Table 2) shows that Example 2 has superior stability. No delamination from the substrate occurs. Comparative Example 2 exhibits delamination from the PPA white reflector and sometime from the silver backplane. Combined with the excellent thermal cycle stability, Example 2 exhibits high reliable material for LED applications.

FIG. 2 shows that examples 2, 4 and 6 exhibit no wire bond opening even after 1000 cycles, while comparative example 2 exhibits wire bond opening after about 200 cycles.

Additional Examples—Phosphor Incorporation into Copolymer Using 3-Roll Milling:

An additional example is also formed that include a phosphor incorporated into the organosiloxane block copolymer using 3-roll mixing. More specifically, a 4.988 g sample of Example 2 is placed on a 3-roll mill (AIMEX BR-150HCV) heated to 80° C. Subsequently, 0.497 g of Intematix phosphor YAG phosphor (NYAG4454) is added to the organosiloxane block copolymer to form a mixture. The mixture is then passed through the 3 roll mill incorporate the phosphor into the organosiloxane block copolymer.

During this process, the phosphor does not agglomerate and no sedimentation is visually observed over two months.

In contrast, when 100 parts of Comparative example 2 are with 3.5 parts of NTAG4851 using the aforementioned method, complete sedimentation of the phosphor is observed after 24 hours.

Additional Examples—Phosphor Incorporation into Copolymer Using Solution Mixing:

An additional sample of Example 2 is dissolved at 70% solids in toluene to form a mixture. Subsequently, the mixture was split into three samples. In a first sample, 25 wt % of CeYAG is added. In a second sample, 25 wt % of CeTAG is added. In a third sample, 25 wt % of EuN is added. This is repeated with samples of Example 4.

Each sample of Examples 2 and 4 is prepared in a 10 mL dental mixer cup, then hand-mixed thoroughly, then mixed with a vortex mixer for ~5 min, and then sonicated for ~45 min.

After mixing, each sample of Examples 2 and 4 is then drawn down into a film using an adjustable draw down bar at 10 mil gap setting on a TEFZEL release liner 104. Each sample of Examples 2 and 4 is excellent in resisting settling of the phosphor. An optical micrograph in transmission mode of Example 2 is set forth as FIG. 3 and shows phosphor homogeneously dispersed therein.

Example 9

Referring again to FIG. 5, the optical assembly 500 may be made as follows: the silicone composition of Example 7 was heated at 100° C. for 30 minutes by hot-press with 1 mm depth mold. A 1 mm thickness B-stage transparent sheet was obtained. An optical device 504 was obtained and was wire bonded to an electrode on a substrate 508 and was set in a compression molding equipment which had dome-shape cavities. The transparent sheet was set in the cavity. Compression molding with the transparent sheet was done at 130° C. for 5 minutes to melt the transparent sheet and cure it in the dome-shape cavities to form the encapsulant 502.

Example 10

Referring again to FIG. 5, the optical assembly 500 may be made as follows: the silicone composition of Example 8 was heated at 100° C. for 15 minutes by hot-press with 1 mm depth mold. A 1 mm thickness B-stage transparent sheet was obtained. An optical device 504 was wire bonded to an electrode on a substrate 508 and was set in a compression molding equipment which had dome-shape cavities. The transparent sheet was set on the cavity. Compression molding with the transparent sheet was done at 130° C. for 5 502 to melt the transparent sheet and cure it in the dome-shape cavities to form the encapsulant 502.

Example 11

Referring again to FIG. 5, the optical assembly 500 may be made as follows: five (5) weight % of YAG yellow phosphor, (NYAG4454, produced by Intematix), was mixed into the silicone composition of Example 7 to prepare a silicone composition with phosphor. The silicone composition with phosphor was heated at 110° C. for 15 minutes by hot-press with a 1 mm depth mold. A 1 mm thickness B-stage phosphor sheet was obtained. An optical device 504 was wire bonded to an electrode on a substrate 508 and was set in a compression molding equipment which had dome-shape cavities. The phosphor sheet was set on the cavity. Compression molding with the transparent sheet of Example 9 was performed at 130° C. for 5 minutes to melt the transparent sheet and cure it in the dome-shape cavities to form the encapsulant 502.

Example 11a

In an example, eight (8) weight % of YAG yellow phosphor, (NYAG4454, produced by Intematix), was mixed into the silicone composition of Example 7 to prepare a silicone composition with phosphor. The silicone composition with phosphor was heated at 120° C. for 15 minutes by hot-press with 300 μm depth mold. A 300 μm thickness B-stage phosphor sheet was obtained. The phosphor sheet was laminated on the transparent sheet of Example 9 (1 mm thick) which was prepared to create a multilayer sheet or encapsulant.

Example 11b

In an example, a fifty (50) weight % of YAG yellow phosphor, (NYAG4454, produced by Intematix), was mixed into the silicone composition of Example 7 to prepare a silicone composition with phosphor. The silicone composition with phosphor was heated at 120° C. for 15 minutes by hot-press with a 60 μm depth mold. A 60 μm thickness B-stage phosphor sheet was obtained. The phosphor sheet was laminated on the transparent sheet of Example 9 (1 mm thick).

Example 12

Figure 6:
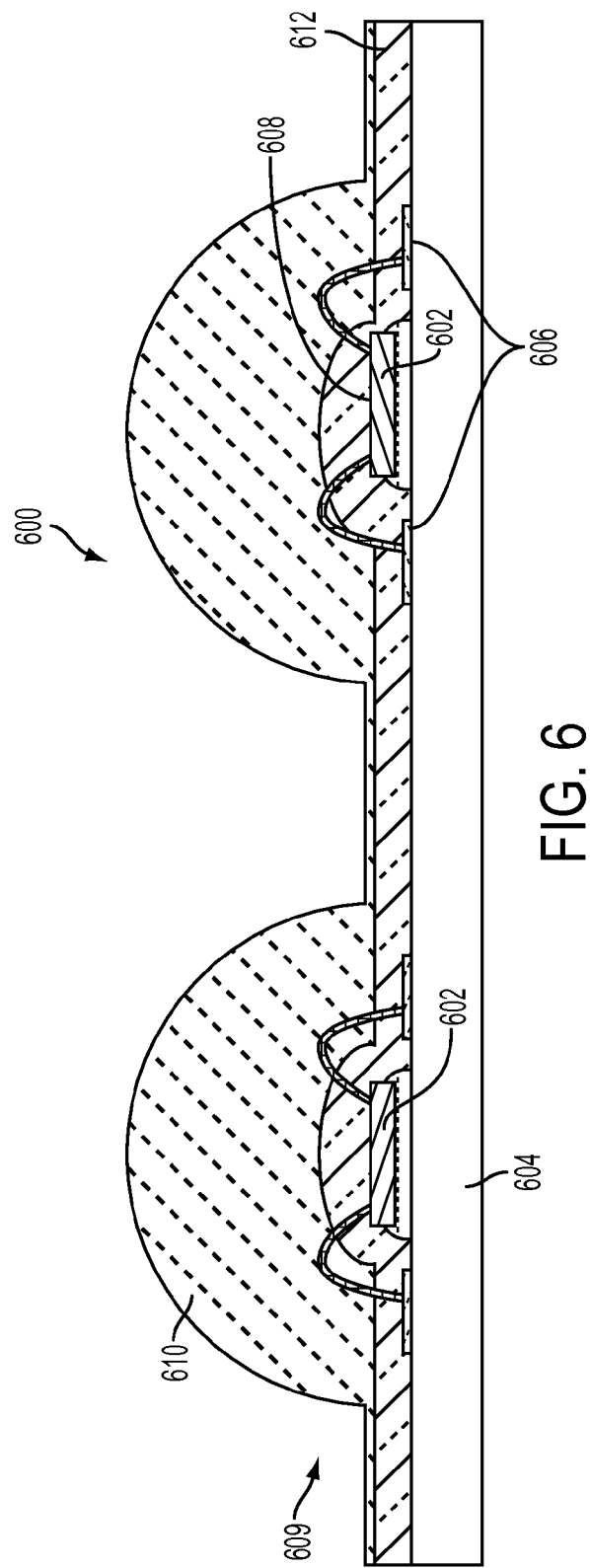
FIG. 6 is an example of an optical assembly.

FIG. 6 is an example of an optical assembly 600, including an optical device 602, such as an LED, wire bonded to a substrate 604. As illustrated, the optical device 602 is wire bonded to an electrode 606 on the substrate. The optical device 602 was set in compression molding equipment which had dome-shape cavities. The multilayer sheet of Example 11a of a body was set in the equipment with the phosphor sheet proximate an optical surface 608 of the optical device 602. Compression molding with the multilayer sheet was done at 130° C. for 5 minutes to melt the multilayer sheet and to cure it in dome-shape cavities. After compression molding, the optical assembly 600 had an encapsulant 609 including a dome-shaped transparent layer 610 and a flat phosphor containing layer 612 covering the optical device 602 and electrodes 606 on the surface of the substrate 604. In various examples, little to not air gap was created between phosphor containing layer 612 and optical devices 602 and electrodes 606. In various examples, the transparent layer 610 did not include phosphor contamination.

Example 13

Referring again to FIG. 6, the optical assembly 600 may be made as follows: the optical device 602 was set in compression molding equipment which had dome-shape cavities. The multilayer sheet of Example 11b that combines to form the encapsulant 609, including transparent layer 610 and the phosphor containing layer 612 (such as of a body 102 of FIG. 1) was set in the equipment, with the phosphor sheet that forms the phosphor containing layer 612 proximate the optical surface 608 of the optical device 602. Compression molding with the multilayer sheet was done at 130° C. for 5 minutes to melt the multilayer sheet and to cure it in the dome-shape cavities. After compression molding, the optical assembly 600 had the encapsulant 609 including the dome-shaped transparent layer 610 and flat phosphor containing layer 612 covering optical devices 602 and electrodes 606. In various examples, little to no air gap was created between phosphor containing layer 612 and the optical devices 602 and electrodes 606. In various examples, the transparent layer 610 did not include substantial or any phosphor contamination.

Example 14

Figure 7:
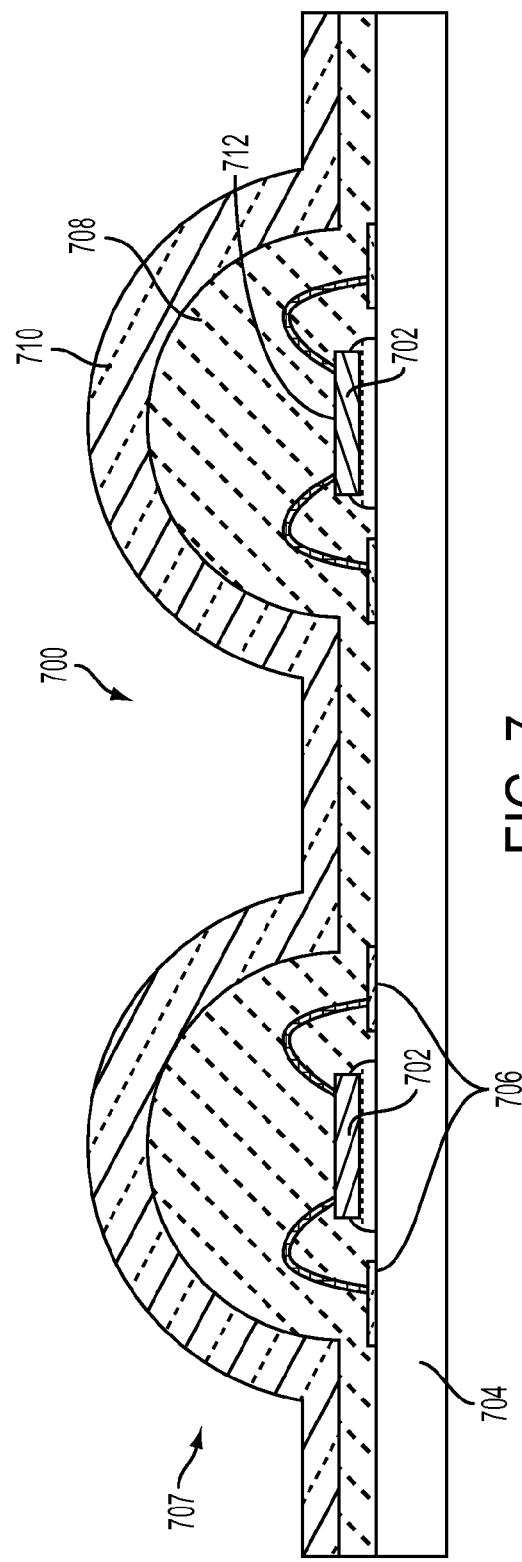
FIG. 7 is an example of an optical assembly.

FIG. 7 is an example of an optical assembly 700 including an optical device 702, such as an LED, and a substrate 704 on which the the optical devices 702 were wire bonded to the electrode 706 on the substrate 704. The optical device 702 was set in compression molding equipment which had dome-shape cavities. The multilayer sheet of Example 11a that forms the encapsulant 707 including the transparent layer 708 and the phosphor containing layer 710 (such as of a body 102 of FIG. 1) of any of a variety of thicknesses was set in the equipment with the encapsulant 708 proximate the optical surface 712 of the optical device 702 and the phosphor sheet 710 distal to the optical surface 712 of the optical device 702 relative to the transparent sheet 708. Compression molding with the multilayer sheet was done at 130° C. for 5 minutes to melt the multilayer sheet and to cure it in the dome-shape cavities. After compression molding, the optical assembly 700 had dome shape encapsulants 707 including the transparent layer 708 and phosphor 710. In various examples, little to not air gap was created between the encapsulant 707 and the optical devices 702 and electrodes 706. In various examples, the transparent layers 708 did not include substantial or any phosphor contamination.

Example 15

Figure 8:
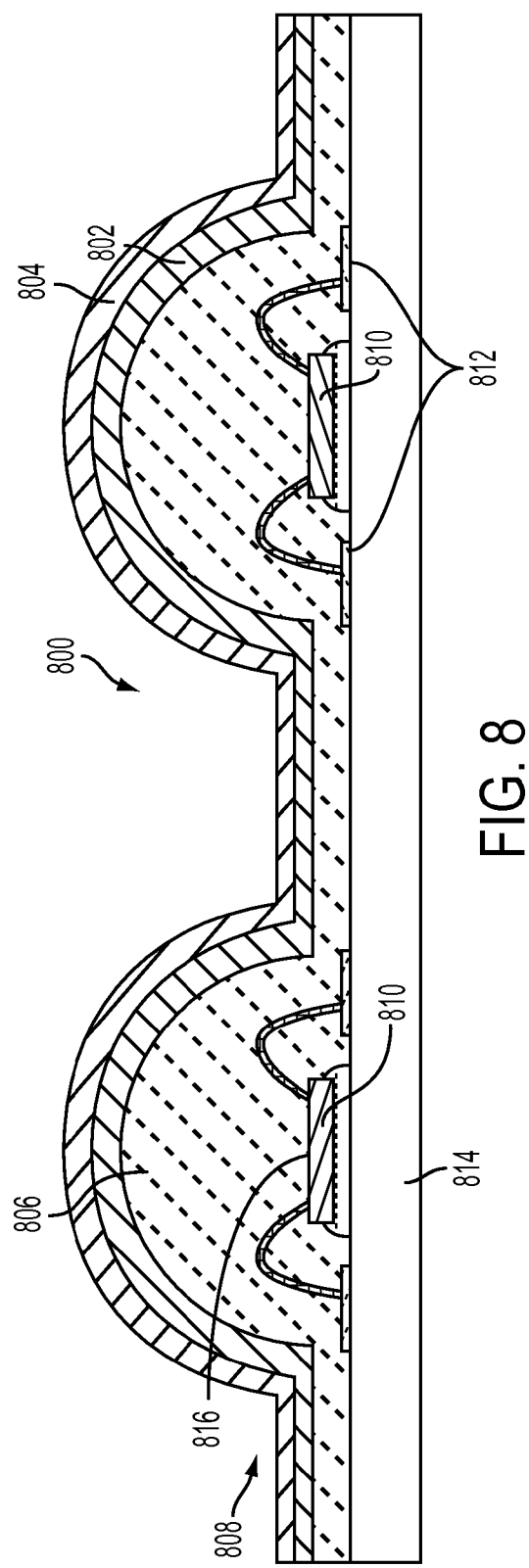
FIG. 8 is an example of an optical assembly.

FIG. 8 is an example of an optical assembly 800 including a forty (40) weight % of silicate green phosphor, (EG3261, produced by Intematix mixed into the silicone composition of Example 8 to prepare the silicone composition with a green phosphor. The silicone composition with green phosphor was heated at 110° C. for 15 minutes by hot-press with a 60 μm depth mold to form a green phosphor layer 802. A ten (10) weight % of nitride red phosphor, (R6535, produced by Intematix), was mixed into the silicone composition of Example 8 to prepare the silicone composition with red phosphor. The silicone composition with red phosphor was heated at 110° C. for 15 minutes by hot-press with a 60 μm depth mold to form a red phosphor layer 804. The green phosphor layer 802 was laminated on the transparent layer 806 of Example 10, and the red phosphor layer 804 was laminated on top of the green phosphor layer 802 to prepare an encapsulant 808. An optical device 810, such as an LED, was wire bonded to an electrode 812 on a substrate 814 and was set in compression molding equipment having dome-shape cavities. The encapsulant 808 was set in the equipment with the transparent layer 806 proximate the optical surface 816 of the optical device 810. Compression molding with the multilayer sheet 808 was done at 130° C. for 5 minutes to melt the multilayer sheet 808 and to cure it in the dome-shape cavities. After compression molding, the optical assembly 800 had transparent dome shape encapsulants 808 with the red phosphor layer 806 and the green phosphor layer 804. In various examples, little to not air gap was created between the transparent layer 806 and the optical devices 810 and electrodes 812. In various examples, the transparent layer 806 did not include substantial or any phosphor contamination.

Example 16

In various examples, any of the optical assemblies 500, 600, 700, 800 may include as a layer the phosphor sheet of Example 11b. In Example 16, the phosphor sheet was cut and portions were removed to make a line patterned and square patterned phosphor sheet. The phosphor sheet was laminated on the transparent sheet of Example 9 to prepare a multilayer sheet with a patterned phosphor layer. An optical device was wire bonded to the electrode on a substrate and was set in a compression molding equipment having dome-shape cavities. The multilayer sheet with the patterned phosphor layer was set in the equipment with the patterned phosphor sheet proximate the optical surface. Compression molding was done at 130° C. for 5 minutes to melt multilayer sheet and to cure it in the dome-shape cavities. After compression molding, the optical assembly had a transparent dome shape encapsulant and flat and patterned phosphor layer. In various examples, little to not air gap was created between phosphor containing layer and LED dies and electrodes. In various examples, the transparent layers did not include substantial or any phosphor contamination.

Example 16a

FIG. 9 is an example of an optical assembly 900. The silicone composition of Example 8 was heated at 110° C. for 15 minutes by hot-press with a 1 mm depth mold to obtain a transparent sheet 902, forming an encapsulant. An optical device 904, which was wire bonded to an electrode 906 on a substrate 908, was set in a vacuum laminator. The transparent sheet 902 was set on the substrate 908 in the vacuum laminator. Air in the vacuum laminator was vacuumed out at 130° C. for 1 minute. After the vacuuming process, the transparent sheet 902 was pressed by laminator at atmosphere for 5 minutes to obtain the optical assembly 900.

Example 17

FIG. 10 is an example of an optical assembly 1000. The silicone composition of Example 8 was heated at 110° C. for 15 minutes by hot-press with a 1 mm depth mold to obtain a transparent sheet 1002. A fifty (50) weight % of YAG yellow phosphor, (NYAG4454, produced by Intematix), was mixed into the silicon composition of Example 8 to prepare silicone composition with phosphor layer 1004. The silicone composition with phosphor was heated at 120° C. for 15 minutes by hot-press with 60 μm depth mold. the phosphor layer 1004 was laminated on a 1 mm thickness transparent sheet 1002 to prepare an encapsulant 1006. An optical device 1008, was wire bonded to the electrode 1010 on a substrate 1012 and, was set in a vacuum laminator. Air in the vacuum laminator was vacuumed out at 130° C. for 1 minute. After the vacuuming process, the encapsulant 1006 was pressed by laminator at atmosphere for 5 minutes to obtain the optical assembly 1000.

Example 18

A glass reactor was loaded with 118 g of methanol, 32 g of concentrated aqueous ammonium hydroxide and 41 g of dimethyl-dimethoxysilane. The above components were stirred, such as by means of electromagnetic stirring, until a substantially uniform mixture was produced. While the mixture was stirred vigorously, 96 g of a methyl-orthosilicate was added. After approximately 10 seconds, when the reaction product turned into a gel-like substance, stirring stopped, and the obtained product was left intact, in a closed and cool environment one week, whereby a dispersion of wet method hydrophobized reinforcing silica was obtained. Methanol and gaseous ammonia were removed from the silica dispersion. The BET surface area of the wet method hydrophobized reinforcing silica was measured and the results of the measurements showed that the obtained wet-method hydrophobized reinforcing silica had a specific surface area equal to 620 $m^2/g$.

Example 19

A hydrophobization agent was prepared by a method described in Official Japanese Patent Publication (Kokoku) No. 61-56255. A reaction was conducted for two hours at 105° C. with 277 g of octamethyl cyclotetrasiloxane, 4.6 g of 1,3,5,7-tetramethyl-1,3,5,7-tetravinylsilox 517 g of methyltrimethoxysilane, and 0.43 g of potassium hydroxide as a catalyst. As a result, a hydrophobization agent consisting of a ring-opened rearranged organopolysiloxane was prepared. The potassium hydroxide was neutralized by carbon gas. Analysis of the obtained polysiloxane showed that the product was made of a linear organopolysiloxane with 0.7 mole % of methyl vinyl siloxy groups. Then, the wet method hydrophobized reinforcing silica was synthesized as follows with the use of the obtained hydrophobization agent. A glass reactor was loaded with 118 g of methanol, 32 g of concentrated aqueous ammonium hydroxide and 39 g of the hydrophobizaton agent obtained above. These components were stirred, such as by means of electromagnetic stirring, until a substantially uniform mixture appeared. While the mixture was stirred vigorously, 96 g of a methyl-orthosilicate was added. After approximately 10 seconds, when the reaction product turned into a gel-like substance, stirring stopped, and the obtained product was left intact, in a closed and cool environment, to age for one week whereby a dispersion of wet method hydrophobized reinforcing silica was obtained. The methanol and gaseous ammonia were removed from the silica dispersion. The BET surface area of the wet-method hydrophobized reinforcing silica was measured and the results of the measurements showed that the obtained wet-method hydrophobized reinforcing silica had a specific surface area equal to 540 $m^2/g$.

Example 20

First, 300 parts of the wet method hydrophobized reinforcing silica dispersion (with the silica comprising 25% of the weight) obtained in Example 19 and 100 parts of a copolymer rubber (with a degree of polymerization equaling 3,000) obtained from methylvinyisiloxane and dimethylsiloxane having molecular chain terminals capped with dimethylvinylsiloxy groups (where dimethylsiloxane units comprised 99.63 mole % and methylvinylsiloxane units comprised 0.37 mole %) were loaded into a kneader-mixer and mixed. The solvent was removed by heating to 90.degree. C. After the volatile components were completely removed, a silicone rubber base was obtained. Then, 100 parts of the obtained silicone rubber base were combined with the following components: 1.5 parts of a copolymer (where the content of the silicon-bonded hydrogen atoms was 1.52 wt. %) of dimethylsiloxane and methylhydridosiloxane having a viscosity of 7 $mm^2/s$ at 25° C. and molecular terminals blocked with trimethylsiloxy groups having a viscosity of 7 $mm^2/s$ at 25° C.; a complex of a chloroplatinic acid and tetramethyldivinylsiloxane in an amount that makes the content of a platinum metal catalyst equal to 10 ppm; 100 ppm of methyl-tris(methylisobutynoxy)silane; 0.5 parts of γ-methacryloxypropyl trimethoxy silane, 0.5 parts of γ-glycidoxypropyl-trimethoxysilane; 0.4 parts of glycerin monoaryl ether. As a result, a transparent silicone rubber composition was prepared. The obtained silicone rubber composition was combined with 0.03 parts of a red azo pigment (xylyl-azoxylydene-2-napthole), to produce a silicone rubber composition of red color. Tensile strength of this silicone rubber composition in an uncured state was measured and showed a magnitude of 2.6 $kg/cm^2$. The obtained silicone rubber composition was extruded into a film-like product through an appropriate extruder nozzle, whereby a 1.0 mm-thick and 5 cm-wide silicone rubber film was produced.

Example 21

Referring to the optical assembly 700 of FIG. 7, in an example, the phosphor containing layer 710 may be or may be replaced with an extruded silicone rubber sheet, made from the silicon rubber composition of Example 21 pressed to 300 μm thickness to prepare a second transparent layer 710. A refractive index of the second transparent layer 710 was 1.41 at 25° C. The second transparent layer 710 was laminated on the first transparent layer 708. In an example, the first transparent layer 708 was made by heating the silicone composition of Example 8 at 110° C. for 15 minutes by hot-press with a 1 mm depth. The refractive index of the first transparent sheet 708 was 1.55 at 25° C. The optical device 702 was wire bonded to the electrode 704 on the substrate 706 and was set in a compression molding equipment having dome-shape cavities. The multilayer sheet was set in the equipment with the first transparent sheet 708 proximate the optical surface 712 of the optical device 702. Compression molding was done at 130° C. for 5 minutes. After compression molding, the optical assembly 700 was produced.

Example 22

Referring to the optical assembly 600 of FIG. 6, in an example, the phosphor containing layer 612 includes or is replaced with an extruded silicone rubber sheet, made from the silicon rubber composition of Example 21. In an example, the extruded silicone rubber sheet, was pressed to 300 μm thickness to prepare a first transparent layer 612. A type-A hardness silicone sheet was created after curing the first transparent layer 612 at 150° C. for 1 hour showed A70 at 25° C. The hardened silicone first transparent layer 612 was laminated on a second transparent layer 610. The second transparent layer 610 was made by heating the silicone composition of Example 8 at 110° C. for 15 minutes by hot-press with a 1 mm depth. The Shore-D hardness of the second transparent layer 610 after curing at 150° C. for 1 hour was Shore-D74 at 25° C. An optical device 602 was wire bonded to the electrode 606 on the substrate 604. The substrate 604 was set in a compression molding equipment having dome-shape cavities. The multilayer sheet was set in the equipment with the first transparent sheet 612 proximate the optical surface 608 of the optical device 602. Compression molding was done at 130° C. for 5 minutes. After compression molding, an optical assembly 600 which had transparent dome shape encapsulants was obtained.

Example 23

FIGS. 11A and 11B illustrate mating a multilayer composition 1100 with an optical device 1102 on a substrate 1104 to form an optical assembly 1106. The multilayer composition 1100, in an example a multilayer silicone composition of Example 8, was heated at 110° C. for 15 minutes by hot-press with a 1 mm depth mold. A twenty (20) weight % of $TiO_2$ particle and fifty (50) weight % ground silica were mixed into a silicone composition to prepare a white silicone composition 1108. The white silicone composition 1108 with $TiO_2$ was heated at 120° C. for 15 minutes by hot-press with a 60 μm depth mold. Hole patterns 1110 were punched out in the white silicone composition 1108. The white silicone composition 11108 with hole pattern 1110 was laminated on a 1 mm thickness B-stage transparent sheet 1112 made by heating the silicone composition of Example 8 at 110° C. for 15 minutes by hot-press with a 1 mm depth, to prepare the multilayer composition 1100. The optical device 1102 was wire bonded to electrodes 1114 on the substrate 1104 and was set in a compression molding equipment having dome-shape cavities. The multilayer sheet 1100 was set in the equipment with the white silicone composition 1108 proximate the optical surface 1116 of the optical device 1102. Compression molding was done at 130° C. for 5 minutes. After compression molding, the optical assembly 1106 which had a transparent dome shape encapsulants was obtained.

One or more of the values described above may vary by ±5%, ±10%, ±15%, ±20%, ±25%, etc. so long as the variance remains within the scope of the disclosure. Unexpected results may be obtained from each member of a Markush group independent from all other members. Each member may be relied upon individually and or in combination and provides adequate support for specific embodiments within the scope of the appended claims. The subject matter of all combinations of independent and dependent claims, both singly and multiply dependent, is herein expressly contemplated. The disclosure is illustrative including words of description rather than of limitation. Many modifications and variations of the present disclosure are possible in light of the above teachings, and the disclosure may be practiced otherwise than as specifically described herein.

In this document, the terms "a," "an," or "the" are used to include one or more than one unless the context clearly dictates otherwise. The term "or" is used to refer to a nonexclusive "or" unless otherwise indicated. In addition, the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more. In some embodiments, the term "substantially" can encompass "completely" or "entirely."

The present invention provides for the following exemplary embodiments, the numbering of which is not to be construed as designating levels of importance:

Embodiment 1 relates to an optical assembly, comprising:
an optical device comprising an optical surface; and
a pre-formed encapsulant film that substantially or entirely covers the optical surface, the encapsulant comprising:
a first layer comprising a first silicone-containing hot melt composition, the first layer having a first major surface and a second major surface; and
a second layer comprising a second silicone-containing hot melt composition, the second layer having a first major surface and a second major surface, the first major surface of the second layer being in contact with the first major surface of the first layer.

Embodiment 2 relates to the optical assembly of Embodiment 1, wherein at least one of the first silicone-containing hot melt composition and the second silicone-containing hot melt composition is a reactive silicone-containing hot melt composition.

Embodiment 3 relates to the optical assembly of Embodiment 1, wherein at least one of the first silicone containing hot melt composition and the second silicone-containing hot melt composition is a non-reactive silicone-containing hot melt composition.

Embodiment 4 relates to the optical assembly of Embodiments 1-3, wherein at least one of the first silicone containing hot melt composition and the second silicone-containing hot melt composition comprises at least one of a resin-linear composition, a hydrosilylation cure composition, a high-phenyl-T composition, a silicon sealant composition, a polyurea-polysiloxane composition, an MQ/polysiloxane composition, an MQ/X-diorganosiloxane composition, a polyimide-polysiloxane composition, a polycarbonate-polysiloxane composition, a polyurethane-polysiloxane composition, a polyacrylate-polysiloxane composition or a polyisobutylene-polysiloxane composition.

Embodiment 5 relates to the optical assembly of Embodiment 4, wherein the resin-linear composition comprises a phase separated, resin-rich phase and a phase separated, linear-rich phase.

Embodiment 6 relates to the optical assembly of Embodiments 1-5, wherein the first layer has material properties that are different from those of the second layer.

Embodiment 7 relates to the optical assembly of Embodiment 6, wherein the material properties of the first and second layers are chosen from the group consisting of a modulus, a hardness, a refractive index, a light transmittance or a thermal conductivity.

Embodiment 8 relates to the optical assembly of Embodiments 1-7, wherein at least one of the first layer and the second layer has a shore A hardness gradient, wherein the shore A hardness gradient is from the first major surface to the second major surface of the first layer or from the first major surface to the second major surface of the second layer.

Embodiment 9 relates to the optical assembly of Embodiments 1-8, wherein at least one of the first layer and the second layer comprises a pattern.

Embodiment 10 relates to the optical assembly of Embodiments 1-9, wherein the second major surface of the second layer is exposed to an environmental condition and wherein the second major surface of the second layer comprises a rough surface.

Embodiment 11 relates to the optical assembly of Embodiments 1-10, wherein the second major surface of the second layer is exposed to an environmental condition and wherein the second major surface of the second layer substantially or entirely repels dust.

Embodiment 12 relates to the optical assembly of Embodiments 1-11, wherein at least one of the first layer and the second layer comprises a refractive index gradient, wherein the refractive index gradient is from the first major surface to the second major surface of the first layer or from the first major surface to the second major surface of the second layer.

Embodiment 13 relates to the optical assembly of Embodiments 1-12, wherein the thickness of the encapsulant is from about 0.5 µm to about 5000 µm.

Embodiment 14 relates to the optical assembly of Embodiments 1-13, wherein at least one of the first and the second layers are cured.

Embodiment 15 relates to the optical assembly of Embodiments 1-14, wherein comprising a tie layer.

Embodiment 16 relates to the optical assembly of Embodiment 15, wherein the tie layer comprises a resin.

Embodiment 17 relates to a pre-formed encapsulant film, comprising:
  a first layer comprising a first silicone-containing hot melt composition, the first layer having a first major surface and a second major surface; and
  a second layer comprising a second silicone-containing hot melt composition, the second layer having a first major surface and a second major surface, the first major surface of the second layer being in contact with the first major surface of the first layer.

Embodiment 18 relates to a method for making an optical assembly, comprising:
  covering an optical surface of an optical device with a pre-formed encapsulant film, the pre-formed encapsulant film comprising:
  a first layer comprising a first silicone-containing hot melt composition, the first layer having a first major surface and a second major surface; and
  a second layer comprising a second silicone-containing hot melt composition, the second layer having a first major surface and a second major surface, the first major surface of the second layer being in contact with the first major surface of the first layer.

Embodiment 19 relates to the method of Embodiment 18, further comprising pre-forming the pre-formed encapsulant film before the covering step.

Embodiment 20 relates to the method of Embodiments 18-19, further comprising compression molding or laminating the pre-formed encapsulant film.

Embodiment 21 relates to the method of Embodiments 18-20, wherein at least one of the first layer or the second layer comprises one or more phosphors.

Embodiment 22 relates to the method of Embodiment 21, wherein the phosphor forms a pattern at least one of the first layer or the second layer.

Embodiment 23 relates to the method of Embodiments 18-22, further comprising curing at least one of the first layer or the second layer, wherein at least one of the first layer or the second layer has the same or a different cure speed than the cure speed of at least one of the other of the first or second layer.

Embodiment 24 relates to the method of Embodiments 18-23, further comprising curing at least one of the first layer or the second layer, wherein at least one of the first layer or the second layer has the same or a different curing mechanism than the curing mechanism of at least one of the other of the first or second layer.

Embodiment 25 relates to the method of Embodiment 24, wherein the curing mechanism comprises a hot melt cure, moisture cure, a hydrosilylation cure, a condensation cure, peroxide cure or a click chemistry-based cure mechanism.

What is claimed is:

1. An optical assembly, comprising:
an optical device comprising an optical surface; and
a pre-formed encapsulant film that substantially or entirely covers the optical surface, the encapsulant comprising:
  a first layer comprising a first silicone-containing hot melt composition, the first layer having a first major surface and a second major surface; and
  a second layer comprising a second silicone-containing hot melt composition, the second layer having a first major surface and a second major surface, the first major surface of the second layer being in contact with the first major surface of the first layer
  wherein the optical device includes a coherent light source or an incoherent light source.

2. The optical assembly of claim 1, wherein at least one of the first silicone-containing hot melt composition and the second silicone-containing hot melt composition is a reactive or non-reactive silicone-containing hot melt composition.

3. The optical assembly of claim 1, wherein at least one of the first silicone containing hot melt composition and the second silicone-containing hot melt composition comprises at least one of a resin-linear composition, a hydrosilylation cure composition, a high-phenyl-T composition, a silicon sealant composition, a polyurea-polysiloxane composition, an MQ/polysiloxane composition, an MQ/X-diorganosiloxane composition, a polyimide-polysiloxane composition, a polycarbonate-polysiloxane composition, a polyurethane-polysiloxane composition, a polyacrylate-polysiloxane composition or a polyisobutylene-polysiloxane composition.

4. The optical assembly of claim 1, wherein at least one of the first layer and the second layer has a shore A hardness gradient, wherein the shore A hardness gradient is from the first major surface to the second major surface of the first layer or from the first major surface to the second major surface of the second layer.

5. The optical assembly of claim 1, wherein the thickness of the encapsulant is from about 0.5 µm to about 5000 µm.

6. The optical assembly of claim 1, wherein at least one of the first and the second layers are cured.

7. The optical assembly of claim 1, further comprising a tie layer.

8. The optical assembly of claim 7, wherein the tie layer comprises a resin.

* * * * *